(12) United States Patent
Srinidhi Embar et al.

(10) Patent No.: US 10,530,306 B2
(45) Date of Patent: Jan. 7, 2020

(54) HYBRID POWER AMPLIFIER CIRCUIT OR SYSTEM WITH COMBINATION LOW-PASS AND HIGH-PASS INTERSTAGE CIRCUITRY AND METHOD OF OPERATING SAME

(71) Applicant: NXP USA, Inc., Austin, TX (US)

(72) Inventors: Ramanujam Srinidhi Embar, Gilbert, AZ (US); Tushar Sharma, Calgary (CA); Joseph Staudinger, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/952,889

(22) Filed: Apr. 13, 2018

(65) Prior Publication Data

US 2019/0319587 A1    Oct. 17, 2019

(51) Int. Cl.
*H03F 3/16*    (2006.01)
*H03F 1/02*    (2006.01)
(Continued)

(52) U.S. Cl.
CPC ..... *H03F 1/0288* (2013.01); *H01L 23/49838* (2013.01); *H01L 23/66* (2013.01); *H01L 24/48* (2013.01); *H03F 1/56* (2013.01); *H03F 3/195* (2013.01); *H03F 3/213* (2013.01); *H05K 1/0243* (2013.01); *H05K 1/181* (2013.01); *H01L 2223/665* (2013.01); *H01L 2223/6655* (2013.01); *H01L 2224/48227* (2013.01); *H01L 2924/1033* (2013.01); *H01L 2924/10253* (2013.01); *H01L 2924/13064* (2013.01);
(Continued)

(58) Field of Classification Search
CPC .......... H03F 1/0288; H03F 1/56; H03F 3/213; H03F 3/195; H05K 1/0243; H05K 1/181; H01L 24/48; H01L 23/66; H01L 23/49838

USPC ............................................... 330/124 R, 295
See application file for complete search history.

(56) References Cited

U.S. PATENT DOCUMENTS 5,379,294 A    1/1995    Ohtake et al.
6,812,794 B1 *  11/2004   Mori ....................... H03F 1/565
                                                    330/277
(Continued)

FOREIGN PATENT DOCUMENTS

EP    2538549 A1    12/2012

OTHER PUBLICATIONS

European Application 17306530.2; not yet published; 61 pages (dated Nov. 6, 2017).
(Continued)

*Primary Examiner* — Khanh V Nguyen
*Assistant Examiner* — Khiem D Nguyen

(57) ABSTRACT

Hybrid power amplifier circuits, modules, or systems, and methods of operating same, are disclosed herein. In one example embodiment, a hybrid power amplifier circuit includes a preliminary stage amplification device, a final stage amplification device, and intermediate circuitry at least indirectly coupling the preliminary stage amplification device and the final stage amplification device. The intermediate circuitry includes a low-pass circuit and a high-pass circuit, and the hybrid power amplifier circuit is configured to amplify a first signal component at a fundamental frequency. Due at least in part to the intermediate circuitry, a phase of a second signal component at a harmonic frequency that is a multiple of the fundamental frequency is shifted.

16 Claims, 9 Drawing Sheets

(51) Int. Cl.

| | | |
|---|---|---|
| *H03F 3/195* | (2006.01) | |
| *H03F 3/213* | (2006.01) | |
| *H03F 1/56* | (2006.01) | |
| *H05K 1/18* | (2006.01) | |
| *H05K 1/02* | (2006.01) | |
| *H01L 23/498* | (2006.01) | |
| *H01L 23/66* | (2006.01) | |
| *H01L 23/00* | (2006.01) | |

(52) U.S. Cl.
CPC ............ *H01L 2924/13091* (2013.01); *H01L 2924/1421* (2013.01); *H03F 2200/165* (2013.01); *H03F 2200/222* (2013.01); *H03F 2200/451* (2013.01); *H05K 2201/1006* (2013.01); *H05K 2201/10166* (2013.01)

(56) References Cited

U.S. PATENT DOCUMENTS

| | | | |
|---|---|---|---|
| 6,864,742 | B2 | 3/2005 | Kobayashi |
| 7,193,473 | B2 | 3/2007 | Pengelley et al. |
| 7,202,734 | B1 | 4/2007 | Raab |
| 7,362,170 | B2 | 4/2008 | Louis |
| 8,368,120 | B2 | 2/2013 | Lidow et al. |
| 8,736,383 | B2 | 5/2014 | Acar et al. |
| 8,803,615 | B2 | 8/2014 | Cabanillas et al. |
| 9,041,472 | B2 | 5/2015 | Chen et al. |
| 9,438,184 | B2 | 9/2016 | Jones et al. |
| 9,531,328 | B2 | 12/2016 | Frei et al. |
| 9,602,063 | B2 | 3/2017 | Kaatz et al. |
| 9,614,517 | B2 | 4/2017 | Krishna |
| 2008/0042774 | A1 | 2/2008 | Talbot |
| 2008/0122542 | A1 | 5/2008 | Bowles et al. |
| 2014/0312975 | A1 | 10/2014 | Embar et al. |
| 2015/0349719 | A1 | 12/2015 | Chen et al. |
| 2017/0359038 | A1 | 12/2017 | Tanaka et al. |
| 2017/0359060 | A1 | 12/2017 | Godycki |

OTHER PUBLICATIONS

Cassan, C. et al; "A 2-stage 150W 2.2GHz Dual Path LDMOS RF Power Amplifier for High Efficiency Applications"; IEEE International Microwave Symposium; pp. 655-658 (Jun. 2008).

Heck, S. et al; "A High Gain SiGe-GaN Switching Power Amplifier in the GHz-Range"; IEEE 13th Annual Wireless and Microwave Technology Conference; 4 pages (Apr. 2012).

Heijden van der, M.P. et al; "A Package-Integrated 50W High-Efficiency RF CMOS-GaN Class-E Power Amplifier"; IEEE MTT-S International Microwave Symposium Digest; 3 pages (Jun. 2013).

Kazior, T.E. et al; "More than Moore: GaN HEMTs and Si CMOS Get It Together"; IEEE Compound Semiconductor Integrated Circuit Symposium; 4 pages (Oct. 2013).

Nunes, L.C. et al; "AM/AM and AM/PM Distortion Generation Mechanisms in Si LDMOS and GaN HEMT Bases RF Power Amplifiers"; IEEE Transactions on Microwave Theory and Techniques, vol. 62, No. 4; pp. 799-809 (Apr. 2014).

Hsu, Shawn S.H. et al; "GaN-on-Silicon Devices and Technologies for RF and Microwave Applications"; IEEE International Symposium on Radio-Frequency Integration Technology; 3 pages (Aug. 2016).

Green, D.S. et al; "A Revolution on the Horizon from DARPA"; IEEE Micowave Magazine; 16 pages (Mar. 2017).

Leckey, J.G.; "A 25W X-band GaN PA in SMT Package"; 9th European Microwave Integrated Circuit Conference, Rome; pp. 397-309 (2014).

Sato, Motonobu et al; "Heterogeneous Integration of Microwave GaN Power Amplifiers with Si Atching Circuits"; IEEE Transactions on Semiconductor Manufacturing, vol. 30, No. 4; pp. 450-455 (Nov. 2017).

Matthaei, George L. Tables of Chebyshev Impedance-Transforming Networks of Low-Pass Filter Form. Proceedings of the IEEE, Aug. 1964, pp. 939-963.

U.S. Appl. No. 15/804,268 titled "Multiple-Stage Power Amplifiers Implemented with Multiple Semiconductor Technologies" filed Nov. 6, 2017.

\* cited by examiner

HYBRID POWER AMPLIFIER CIRCUIT OR SYSTEM WITH COMBINATION LOW-PASS AND HIGH-PASS INTERSTAGE CIRCUITRY AND METHOD OF OPERATING SAME

CROSS-REFERENCE TO RELATED APPLICATIONS

STATEMENT REGARDING FEDERALLY SPONSORED RESEARCH OR DEVELOPMENT

FIELD OF THE DISCLOSURE

The present disclosure relates to electrical circuits and systems and methods of operating same and, more particularly, to such electrical circuits, systems, and methods in which the electrical circuits or systems serve as power amplifiers such as Doherty power amplifiers.

BACKGROUND OF THE DISCLOSURE

High-efficiency power amplifier (PA) design is increasingly becoming an integral part of wireless communication systems. The cellular base station market is slowly transitioning to gallium-nitride (GaN) based RF products that are expected to be suitable for fifth generation (5G) communications. Improvement of final-stage PA performance characteristics such as gain, output power, linearity, and DC-RF conversion efficiency remains a focus for researchers now within the context of stringent massive multiple input multiple output (MIMO) 5G requirements.

In general, a GaN device lends itself to high efficiency by carefully optimizing gate and drain I-V (current-voltage) waveforms. A GaN PA design often presents second harmonic frequency (or "2f0") short termination (or in other cases non-short termination) at the gate or drain node of a GaN device employed by the GaN PA. However, due to device extrinsic parasitics, such a manner of termination can create a bottleneck that inhibits achieving optimum PA performance. Also, process variation of device technologies can result in part-to-part variation, which can produce variability in terms of optimum harmonic terminations. Hence, for industrial applications it is desirable to enable tunability to exploit PA performance fully and maximize the yield in the production environment.

For at least these reasons, therefore, it would be advantageous if one or more improved circuits, systems, or methods, and particularly one or more improved PA circuits, PA systems, or PA methods, could be developed in which improvements relating to any one or more of the above concerns, or one or more other concerns, could be achieved.

DETAILED DESCRIPTION

Recently there has been significant focus on designing front-end modules for multiple input multiple output (MIMO) applications, with particular efforts being made to push or enhance the RF transmission performance of PA devices. Although one conventional hybrid PA architecture, in which a LDMOS (Laterally Diffused Metal Oxide Semiconductor) device serves to drive a final-stage GaN device, offers certain benefits by comparison with other designs, various challenges continue to exist in regard to the implementation of this architecture. More particularly, one such challenge that exists with this architecture is that it is difficult to produce a design having an interstage match that both (i) presents a 2f0 short at a GaN input terminal and also (ii) achieves a design friendly load impedance at a LDMOS output terminal with lower reactance.

Figure 1:
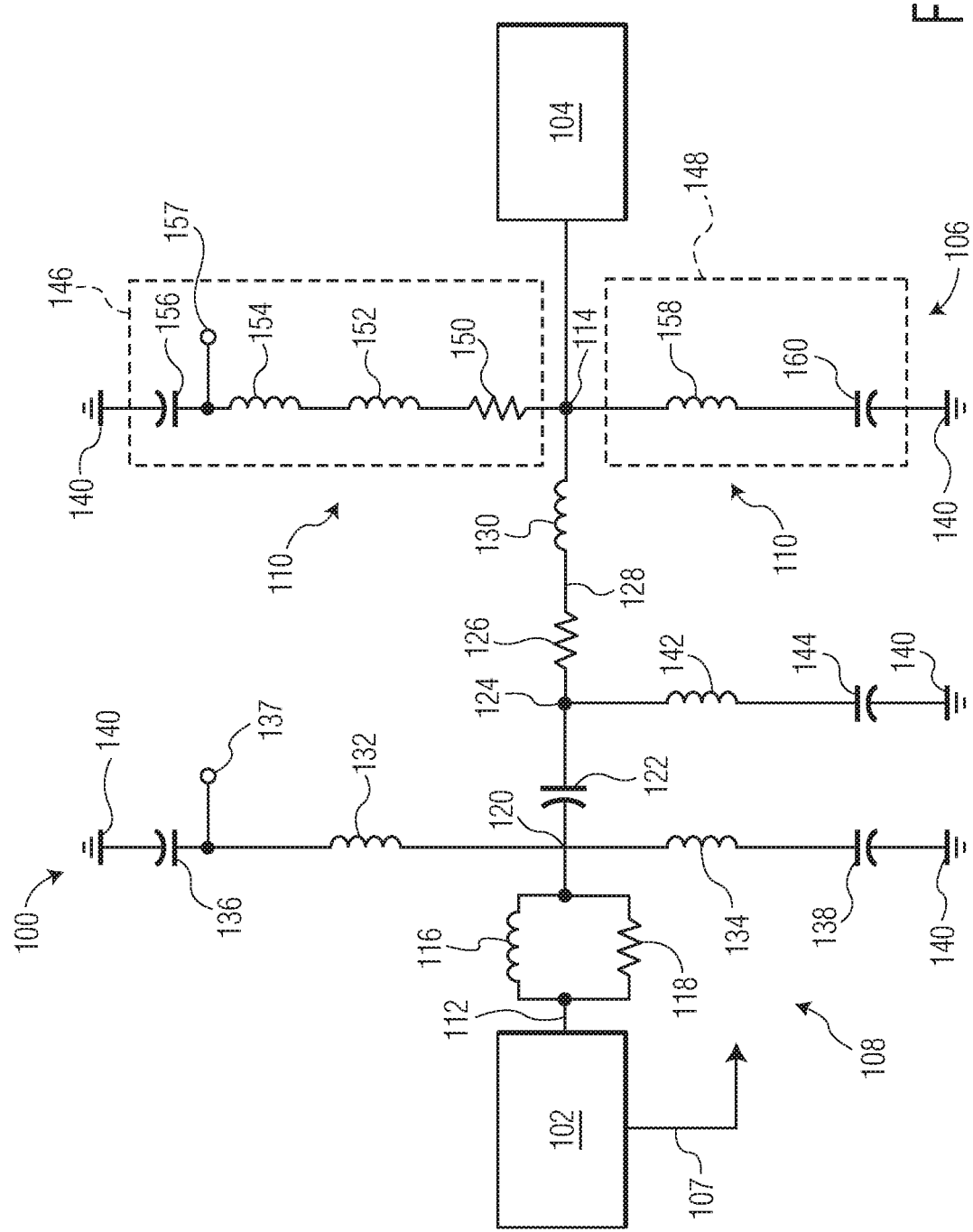
FIG. 1 is a schematic diagram illustrating a hybrid power amplifier (PA) circuit.

Referring to FIG. 1, an example hybrid PA circuit 100 with the aforementioned architecture is shown. The hybrid PA circuit 100 includes a preliminary (or first) stage LDMOS device 102, a final stage GaN device 104, and intermediate circuitry 106 linking those two devices. The circuit 100 is configured so that the preliminary stage LDMOS device 102 operates to drive the final stage GaN device 104 by way of the intermediate circuitry 106. Also as shown, the intermediate circuitry 106 includes a first circuit portion 108 and a second circuit portion 110. The first circuit portion 108 is coupled between a first node 112 that is an output port of the LDMOS device 102 (e.g., a drain terminal of the LDMOS device) and a second node 114 that is an input port of the GaN device 104 (e.g., a gate terminal of the GaN device).

More particularly as shown, in the present example embodiment, the first circuit portion 108 includes a first inductor 116 and a first resistor 118 coupled in parallel between the first node 112 and a third node 120, a first capacitor 122 coupled between the third node 120 and a fourth node 124, a second resistor 126 coupled between the fourth node 124 and a fifth node 128, and a second inductor 130 coupled between the fifth node 126 and the second node 114. Additionally, the first circuit portion 108 also includes a third inductor 132 and a fourth inductor 134, each of which is coupled to the third node 120, as well as a second capacitor 136 and a third capacitor 138. As shown, the third inductor 132 is coupled between the third node 120 and the second capacitor 136, which in turn is coupled between the third inductor and a ground (or ground terminal) 140. A node 137 between the third inductor 132 and the second capacitor 136 can serve as a DC bias input port. Also, the fourth inductor 134 is coupled between the third node 120 and the third capacitor 138, which in turn is coupled between the fourth inductor and the ground 140. Further, the first circuit portion 108 also includes a fifth inductor 142 and a fourth capacitor 144, where the fifth inductor is coupled between the fourth node 124 and the fourth capacitor, which in turn is coupled between the fifth inductor and the ground 140.

As for the second circuit portion 110, in contrast to the first circuit portion 108, the second circuit portion does not link the first node 112 with the second node 114. Rather, the second circuit portion 110 includes a third circuit portion 146 and a fourth circuit portion 148, each of which is coupled between the second node 114 and the ground 140. As shown, the third circuit portion 146 includes a third resistor 150, a sixth inductor 152, a seventh inductor 154, and a fifth capacitor 156, where the third resistor is coupled between the second node 114 and the sixth inductor, the sixth inductor is coupled between that resistor and the seventh inductor, the seventh inductor is coupled between the sixth inductor and the fifth capacitor, and the fifth capacitor is coupled between the seventh inductor and the ground 140. Further, the fourth circuit portion 148 includes an eighth inductor 158 and a sixth capacitor 160, where the eighth inductor 158 is coupled between the second node 114 and the sixth capacitor, and sixth capacitor is coupled between the eighth inductor and the ground 140.

It should be appreciated that the first circuit portion 108, in addition to communicating signals between the LDMOS device 102 and the GaN device 104, also serves to provide matching, particularly with respect to signals at or around a fundamental frequency ("f0")—that is, matching at a fundamental (frequency) band. In contrast, the fourth circuit portion 148 (of the second circuit portion 110) particularly serves to provide termination of the 2f0 (again, second harmonic frequency) at the second node 114, which again can be a transistor gate terminal of the final stage GaN device 104. Further, the third circuit portion 146 (of the second circuit portion 110) particularly serves to provide DC biasing to the second node 114, which is the gate terminal of the final stage GaN device (transistor) 104, with the DC bias being applicable at a node 157 that can serve as a DC bias input port. Also, the third circuit portion 146 can assist the fourth circuit portion 148 with 2f0 termination. Yet although the intermediate circuitry 106, and particularly the second circuit portion 110 thereof, does provide 2f0 termination at the second node 114, the operation of the intermediate circuitry 106 in this regard may not be ideal. To the contrary, when the 2f0 termination is applied by the second circuit portion 110, this tends to impact the fundamental impedance, thereby causing efficiency degradation. Further, the 2f0 termination also impacts the fundamental load in higher Q regions.

Additionally, the second harmonic source termination has very low tunability for different values of capacitances for a fixed bond wire inductance. This can be problematic when implementing circuits such as the hybrid PA circuit 100 because, given that designers typically do not have access to an intrinsic plane at source, input tunability can be important for the purpose of addressing input nonlinearities, especially in the case of GaN devices. In the circuit 100 of FIG. 1, the response over frequency of the impedance looking inward toward the intermediate circuitry 106 (and the final stage GaN device 104) from the LDMOS device 102, as represented by an arrow 107, particularly may become quite dispersive when the second circuit portion 110 is placed in the intermediate (interstage) circuitry 106. Further, the Q of impedance of the intermediate circuitry 106 may be quite a bit higher by comparison with circuitry in which the 2f0 termination is not provided, such as a case where the second circuit portion 110 is not present.

Thus, a circuit such as the hybrid PA circuit 100 can suffer from any one or more of a number of shortcomings. For example, the circuit may lack immunity to fundamental match (or fundamental frequency matching). Also, the circuit may exhibit relatively low tunability in regard to the second harmonic frequency (2f0) or frequency band. Further, the circuit may exhibit relatively high dispersion at the fundamental frequency (f0) for variability at the second harmonic frequency (2f0) or frequency band. Also, the circuit may exhibit higher Q for matching because of the 2f0 termination circuitry. Additionally, the circuit may exhibit relatively high fundamental impedance dispersion and lower 2f0 tunability at the GaN device input (e.g., at the gate input).

The present disclosure encompasses a variety of circuits, systems, and methods of operating circuits or systems, and particularly hybrid power amplifier (PA) circuits, systems, and methods of such circuits or systems, in which the circuits or systems include a combination low-pass-high-pass cascaded topology between a preliminary or first stage device and a final stage device that is driven by the preliminary or first stage device. In at least some embodiments encompassed herein, the combination low-pass-high-pass cascaded topology particularly can take the form of a hybrid PA circuit having at least one preliminary or first stage device that is a silicon driver stage (or driver) in combination with a final stage device that is driven by the driver. Further, in some such embodiments, the at least one preliminary and final stage devices are linked by way of intermediate circuitry that includes both low-pass filter circuitry and also high-pass filter circuitry. Also, in at least some such embodiments, the preliminary stage device can be provided on a first die and the final stage device can be provided on a second die, with portions of the intermediate circuitry being positioned for example on and/or integrated within the first die (or instead the second die).

Further for example, in some embodiments encompassed herein, a hybrid PA circuit includes a LDMOS (Laterally Diffused Metal Oxide Semiconductor) device that constitutes a preliminary stage device, and also a gallium-nitride (GaN) device that is a final stage device that is driven, where the LDMOS device is coupled to the GaN device by way of intermediate circuitry that includes low-pass filter circuitry and high-pass filter circuitry. Additionally, in at least some such embodiments, the low-pass filter circuitry can encompass a single low-pass filter section or a network of multiple low-pass filter sections, and/or the high-pass filter circuitry can encompass a single high-pass filter section or a network of multiple high-pass filter sections. Such low-pass and high-pass filter circuitry can serve as, in at least some embodiments, compact interstage matching networks with harmonic traps in front-end modules or circuits.

In additional embodiments also encompassed herein, the devices or intermediate circuitry can take other forms. For example, the final stage device can be another III-V device (e.g., a device made from of any of GaN, gallium arsenide (GaAs), gallium phosphide (GaP), indium phosphide (InP), indium antimonide (InSb)). Indeed, the present disclosure is intended to encompass a variety of improved hybrid PA circuit (or system) designs that employ or are based upon any of a variety GaAs, GaN, Si-LDMOS or other semiconductor technologies, or any of a variety of passive filter networks. Also, it should be appreciated that devices of the above types are intended to encompass compound or related arrangements—for example, GaN devices are intended to encompass GaN on silicon carbide devices, GaN on silicon devices, etc.

Further in at least some embodiments encompassed herein, an improved hybrid PA circuit employs series and parallel LC resonance circuits that serve as the combination low-pass-high-pass cascaded topology. Such series and parallel LC resonance circuits are configured to resonate at the fundamental frequency (f0), the second harmonic frequency (two times the fundamental frequency, or 2f0), and/or possibly other frequencies (e.g., other harmonic frequencies based upon the fundamental frequency, such as a third harmonic frequency (3f0), a fourth harmonic frequency (4f0), etc.). Depending upon the embodiment, resonance circuits can also be implemented using different forms of transmission lines such as bondwires, lumped inductors, distributed microstrip lines or strip lines, surface-mount and/or MIM (metal-insulator-metal) capacitors. By suitably combining various blocks (e.g., resonant circuit blocks), higher order harmonics (e.g., 2f0) may be separately optimized without significantly affecting the fundamental impedance.

By virtue of employing such a combination low-pass-high-pass cascade topology, in at least some embodiments, a hybrid PA circuit may advantageously achieve interstage matching between the at least one preliminary stage device and the final stage device. In contrast to at least some alternative arrangements, such a hybrid PA circuit with a combination low-pass-high-pass cascaded topology in at least some embodiments may advantageously provide flexibility in optimizing 2f0 (second harmonic frequency) phase at a gate terminal of the final stage (e.g., GaN) device, which can significantly contribute to the boosting of PA efficiency. Also, in at least some such embodiments, the combination of low-pass and high-pass filtering circuitry allows optimization of the 2f0 in a manner by which fundamental impedance is not significantly affected. Nevertheless, 2f0 phase may be independently varied by optimizing the filter network elements, and thus the harmonic termination may be varied to optimize RF performance of the hybrid PA circuit.

Further, also in contrast to at least some alternative arrangements, such a hybrid PA circuit with a combination low-pass-high-pass cascaded topology in at least some embodiments may advantageously sustain design friendly LDMOS load impedance with lower reactance. Thus, in at least some embodiments, such a hybrid PA circuit with a combination low-pass-high-pass cascaded topology not only may increase second harmonic tuning flexibility, but also may do so without any (or substantial) negative impact upon fundamental impedance (e.g., the impedance associated with f0, the fundamental frequency of the circuit). Indeed, in at least some such embodiments, such a hybrid PA circuit with a combination low-pass-high-pass cascaded topology may provide flexibility in terminating an input of the GaN device with a range of harmonic traps and still sustain design friendly LDMOS load impedance.

Figure 2:
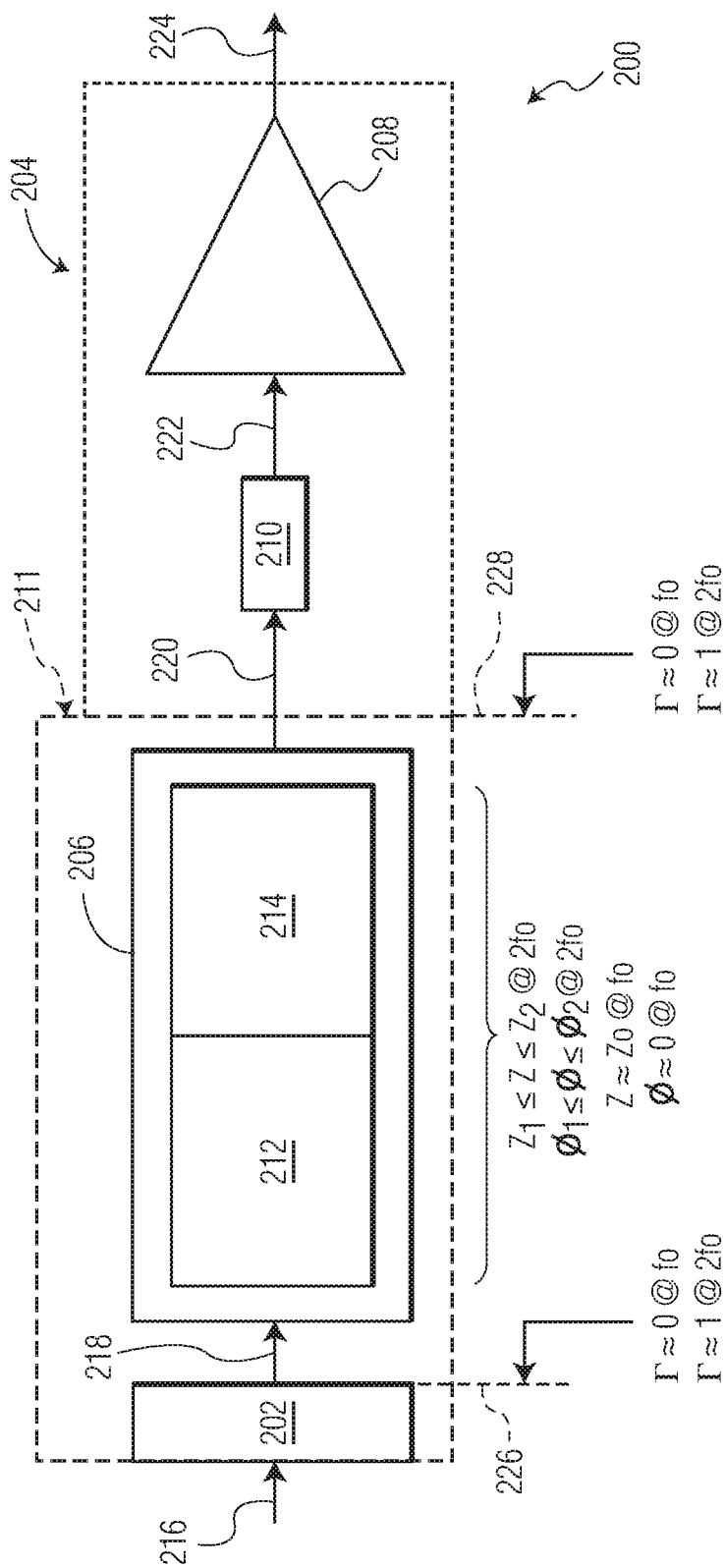
FIG. 2 is a schematic diagram illustrating in general form an improved hybrid PA circuit having a combination low-pass-high-pass cascaded topology, as well as several operational characteristics of that circuit.

Referring to FIG. 2, a high-level schematic block diagram is provided that shows a hybrid power amplifier (PA) circuit 200 having a combination low-pass-high-pass cascaded topology, in accordance with one example embodiment encompassed herein. As illustrated, the circuit 200 includes a preliminary (or first) stage device 202, a final stage device 204, and intermediate circuitry (or an intermediate circuit) 206 linking those two devices. Given that the intermediate circuitry 206 couples, either directly as shown or at least indirectly, the preliminary stage device 202 and the final stage device 204, the intermediate circuitry can also be referred to as interstage circuitry or as an interstage circuit. In the present embodiment, the final stage device 204 is a GaN device and the preliminary stage device 202 is a silicon (e.g., Si-LDMOS) device. Nevertheless, the present disclosure is also intended to encompass other embodiments including, for example, embodiments in which that final stage device is another III-V device (e.g., a device made from any of GaN, GaAs, GaP, InP, or InSb).

As illustrated, the final stage device 204 particularly includes both a final stage PA transistor device 208 as well as input pre-matching circuitry 210. In other embodiments, the input pre-matching circuitry can be considered part of the intermediate circuitry 206. Also, in the present embodiment, the preliminary stage device 202 is a silicon-based PA device. As will be described in further detail below, in at least some embodiments, the preliminary stage device 202 alone, or possibly both the preliminary stage device 202 and some or all portions of the intermediate circuitry 206 (including possibly as well one or more portions of the input pre-matching circuitry 210) as represented by a dashed box 211, can be implemented on a silicon die. Further, the final stage device 204, or at least the transistor device 208, may be implemented on an additional die, which for example can be a GaN (or GaAs or other III-V material) die, where a GaN die can for example include any of a die involving GaN on silicon, a die involving GaN on silicon carbide, etc. Both such dies (that is, both the die employed for the preliminary stage device 202, alone or possibly with some or all portions of the intermediate circuitry 206, and the die employed for the final stage device 204 or one or more portions thereof) can be implemented together, alone or with additional circuitry, as a packaged device.

Additionally as described in further detail below, the intermediate circuitry 206 in the present embodiment includes one or more phase networks that particularly include low-pass circuitry 212 and high-pass circuitry 214. As additionally illustrated, signal flow proceeds through the circuit 200 generally as indicated by a series of arrows 216, 218, 220, 222 and 224. More particularly, in the present example embodiment, an input signal represented by the arrow 216, which can be a RF input signal, is received by the preliminary stage device 202. Upon amplification or other processing of the input signal occurring by way of the preliminary stage device 202, the preliminary stage device provides a modified input signal as represented by the arrow 218 for receipt by the intermediate circuitry 206. As already mentioned, the intermediate circuitry 206 includes, among possibly a variety of different circuit components, the low-pass circuitry 212 and the high-pass circuitry 214.

Upon processing of the modified input signal represented by the arrow 218 by the intermediate circuitry 206 including the low-pass and high-pass circuitry 212, 214, the intermediate circuitry outputs a processed signal represented by the arrow 220 for receipt by the final stage device 204 and particularly the input pre-matching circuitry 210 thereof. Upon further processing of the received processed input signal represented by the arrow 220 by the input pre-matching circuitry 210, the input pre-matching circuitry in turn provides a further processed input signal represented by the arrow 222 for receipt by the transistor device 208. The transistor device 208 in turn amplifies and/or otherwise processes the further processed input signal represented by the arrow 222 so as to generate an output signal represented by the arrow 224, which can be a RF output signal.

Figure 3:
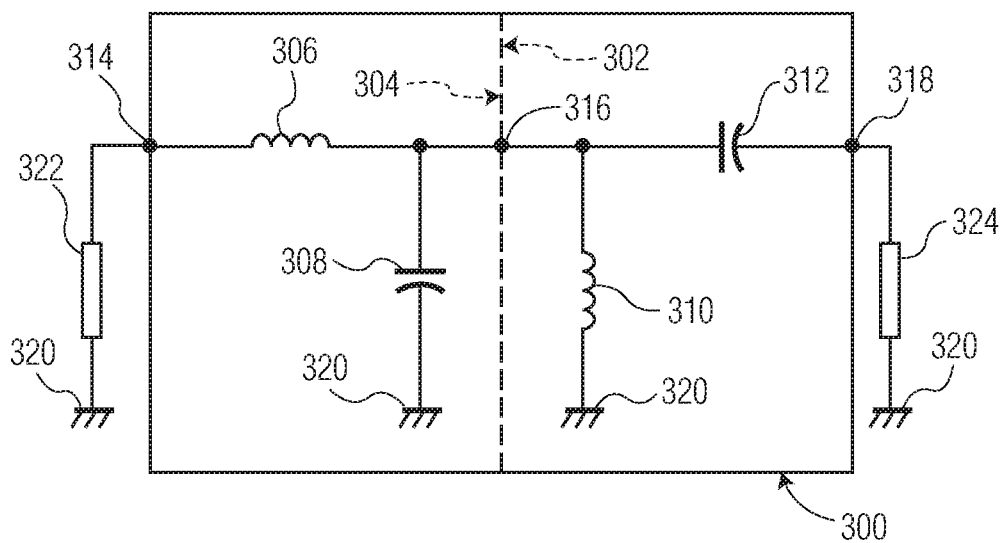
FIG. 3 is a schematic diagram illustrating example low-pass and high-pass circuits that can be employed in intermediate circuitry of the improved hybrid PA circuit of FIG. 2, in relation to other portions of that improved hybrid PA circuit shown in schematic form.

The intermediate circuitry 206, and the low-pass circuitry 212 and high-pass circuitry 214 thereof, can take a variety of forms depending upon the embodiment. Referring additionally to FIG. 3, in a first embodiment, the intermediate circuitry 206, and particularly the combination of the low-pass circuitry 212 and high-pass circuitry 214, can take the form of a circuit 300. As shown, the circuit 300 includes particularly a low-pass circuit 302 and a high-pass circuit 304 that respectively correspond to the low-pass circuitry 212 and high-pass circuitry 214, respectively. In this example embodiment, the low-pass circuit 302 includes a first inductor 306 and first capacitor 308, and the high-pass circuit 304 includes a second inductor 310 and a second capacitor 312. Further, the first inductor 306 of the low-pass circuit 302 is coupled between an input port 314 and an intermediate node 316 at which the low-pass circuit 302 is coupled to the high-pass circuit 304. Further, the second capacitor 312 is coupled between the intermediate node 316 and an output terminal 318 (which can be considered a field effect transistor (FET) input terminal). Additionally, the first capacitor 308 of the low-pass circuit 302 is coupled between the intermediate node 316 and a ground terminal (or ground) 320, and also the second inductor of the high-pass circuit 304 is coupled between the intermediate node 316 and the ground 320.

Circuit 300 may be configured for operation at a fundamental frequency of operation (f0) in a range of about 800 megahertz (MHz) to about 6.0 gigahertz (GHz). In such embodiments, the first inductor 306 has an inductance value in a range of about zero (0) nanohenries (nH) to about fifty (50) nH, the first capacitor 308 has a capacitance value in a range of about zero (0) picofarads (pF) to about fifty (50) pF, the second inductor 310 has an inductance value in a range of about 0 nH to about 50 nH, and the second capacitor 312 has a capacitance value in a range of about 0 pF to about 50 pF. In other embodiments, circuit 300 may be designed to operate at lower or higher fundamental frequencies, and the various capacitance and inductance ranges may have lower or higher boundaries. Either way, low-pass circuit 302 is configured to pass RF signal energy up to a first cutoff frequency slightly greater than the fundamental frequency (e.g., from about 1% up to about 10% above the fundamental frequency) to node 316, and to shunt RF signal energy above that first cutoff frequency to the ground terminal 320. In addition, high-pass circuit 304 is configured to shunt RF signal energy with frequencies just below a second cutoff frequency slightly below the fundamental frequency (e.g., from about 1% up to about 10% below the fundamental frequency) to the ground terminal 320, and to pass RF signal energy above the second cutoff frequency to node 318.

It should be appreciated that the schematic of FIG. 3 represents in some respects a further simplified version of the circuit 200 of FIG. 2. Rather than illustrating all of the components that can be present depending upon the embodiment of the intermediate circuitry 206, the circuit 300 merely includes the low-pass circuit 302 that is an example embodiment (or version) of the low-pass circuitry 212 and the high-pass circuit 304 that is an example embodiment (or version) of the high-pass circuitry 214. Nevertheless, it should be appreciated that in other embodiments the intermediate circuitry 206 can include additional circuit components above and beyond, or other circuit components instead of, those shown in the circuit 300 including, for example, additional components that are described below in regard to FIG. 4, FIG. 5, and FIG. 7. Additionally, the schematic of FIG. 3 represents the presence of the preliminary stage device 202 and the final stage device 204 of FIG. 2 by way of a source impedance or resistance 322 and a load impedance or resistance 324, which are respectively coupled between the input terminal 314 and the ground 320 and between the output terminal 318 and the ground 320, respectively. It should be appreciated that, notwithstanding this manner of representing the presence of the preliminary stage device 202 and the final stage device 204, in practice the actual (e.g., silicon, GaN, etc.) transistor devices described above alone or in combination with additional components will be present at these locations in relation to the circuit 300.

Figure 4:
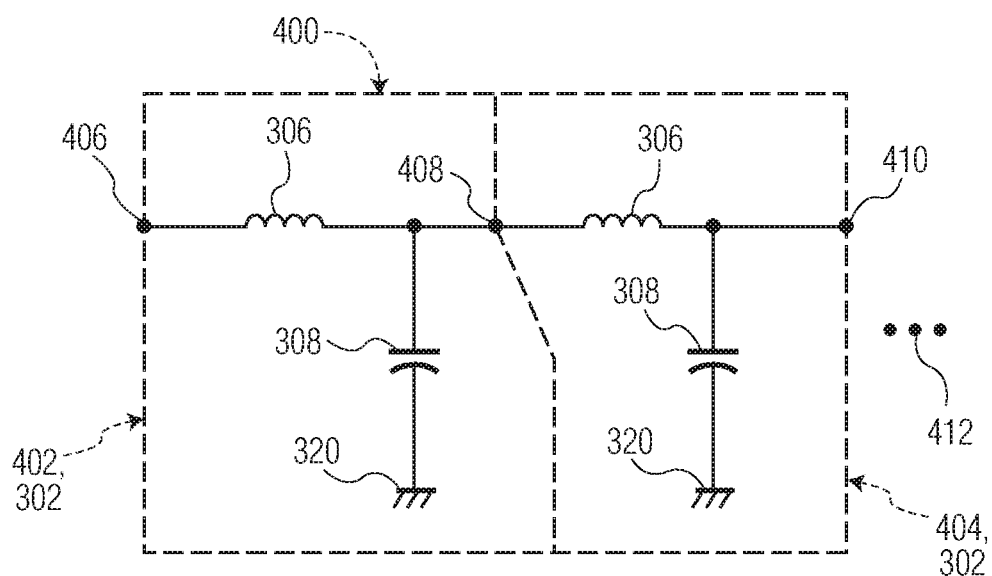
FIG. 4 and FIG. 5 respectively are schematic diagrams that respectively show another low-pass circuit and another high-pass circuit, respectively, which can be employed in the intermediate circuitry of the improved hybrid PA circuit of FIG. 2.

It should be appreciated that in other embodiments the low-pass circuitry 212 and high-pass circuitry 214 of the intermediate circuitry 206 can take any a variety of forms and need not be limited to the form of the circuit 300 shown in FIG. 3. For example, in some embodiments as shown in FIG. 4, the low-pass circuitry 212 need not be limited to the combination of a single inductor and single capacitor as shown in FIG. 3, but rather can take the form of a network circuit 400 that includes several of the low-pass circuits 302 coupled in series with one another. More particularly as shown in FIG. 4, the network circuit 400 can for example include a first one 402 of the low-pass circuits 302 including the inductor 306 and capacitor 308, as well as a second one 404 of the low-pass circuits 302 that also includes the inductor 306 and capacitor 308.

Further as illustrated, in the embodiment of FIG. 4, the network circuit 400 includes an input terminal 406 and an intermediate terminal 410 that respectively correspond to the input terminal 314 and the intermediate node (or terminal) 316 of FIG. 3. Further in this embodiment, the first one 402 of the low-pass circuits 302 and the second one 404 of the low-pass circuits 302 are coupled at a further node 408. The further node 408 can be considered to correspond to the intermediate node 316 for the first one 402 of the low-pass circuits 302, and can be considered to correspond to the input terminal 314 of the second one 404 of the low-pass circuits 302. Although the network circuit 400 is shown to include two of the low-pass circuits 302, as illustrated by an ellipsis 412 any arbitrary number of low-pass circuits 302 can be coupled in series with one another to form a low-pass circuitry network circuit, rather than merely two of the low-pass circuits. In such embodiments, each successive one of the low-pass circuits 302 would have an input terminal that is coupled to an output port of the preceding low-pass circuit, that is, coupled to the node linking the capacitor and inductor of that preceding low-pass circuit. Further in this regard, it should be appreciated that multiple low-pass (and/or high-pass) circuits can be implemented to manipulate filter bandwidth, passband insertion loss and slope/roll-off behavior and, in at least some such embodiments, the inductance (L) and capacitance (C) values would then be different compared to single-section circuit (with the cutoff frequency assumed to be unaltered).

Figure 5:
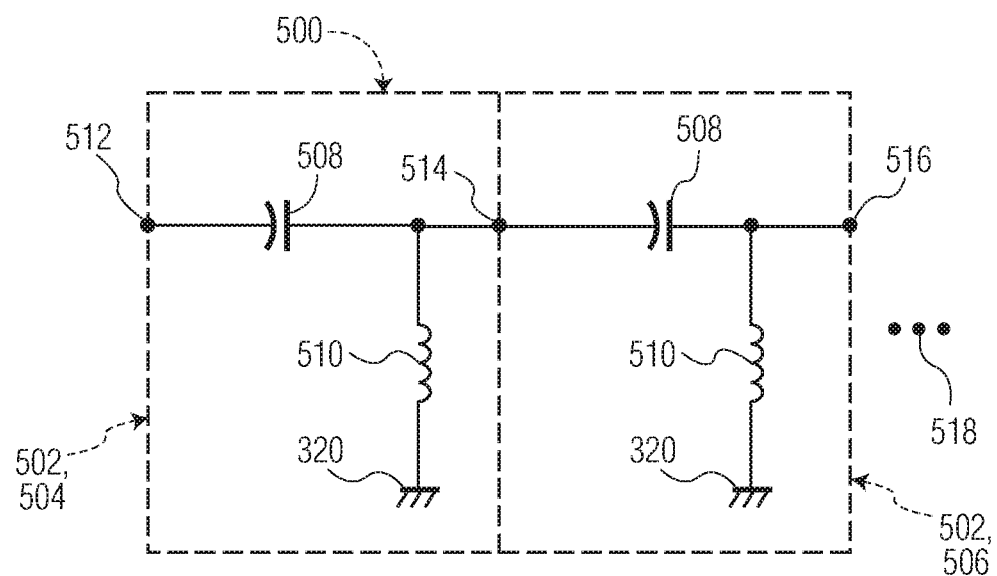

Likewise, referring to FIG. 5, it should be appreciated that in alternative embodiments other high-pass circuits can be used in place of the high-pass circuit 304. One such embodiment is shown in FIG. 5 as a network circuit 500. In this example embodiment, the network circuit 500 particularly includes a pair of high-pass circuits 502, that is, a first one 504 of the high-pass circuits 502 and a second one 506 of the high-pass circuits 502. Further as shown, each of the high-pass circuits 502 includes a capacitor 508 and an inductor 510 that are coupled in series with one another. Each of the inductors 510 is coupled between the respective capacitor and the ground 320. In contrast to the high-pass circuit 304 of FIG. 3, the respective inductor 510 of each of the high-pass circuits 502 is coupled to the respective capacitor 508 of the respective high-pass circuit at a node that serves as the output node for that respective high-pass circuit rather than the input node of that respective high-pass circuit. That is, in contract to the high-pass circuit 304 in which the second inductor 310 is coupled to the second capacitor 312 upstream of that capacitor, in the embodiment of FIG. 5 the inductor 510 of each of the high-pass circuits 502 is coupled downstream of the respective capacitor 508 of the respective high-pass circuit.

Further as illustrated, the network circuit 500 includes an input terminal 512 that can be understood as corresponding to the intermediate node 316 of FIG. 3—that is, the input terminal 512 can constitute the node by which the network circuit 500 is coupled to low-pass circuitry such as the network circuit 400. Additionally, the network circuit 500 includes an output terminal 516 that can be considered to correspond to the output terminal 318 of FIG. 3, and that serves as the node at which the capacitor 508 and inductor 510 of the second one 506 of the high-pass circuits 502 are coupled to one another. Also, the network circuit 500 includes a further node 514 that serves as a junction at which the second one 506 of the high-pass circuits 502 is coupled to the first one 504 of the high-pass circuits 502. More particularly, in this embodiment, given the downstream positioning of the inductors 510 relative to the capacitors 508, the further node 514 is the node linking the inductor 510 and the capacitor 508 of the first one 504 of the high-pass circuits 502, as well as the input node of the second one 506 of the high-pass circuits 502. Also as shown, the capacitor 508 of the second one 506 of the high-pass circuits 502 is coupled between the further node 514 and the output terminal 516.

Although the network circuit 500 is shown to include two of the high-pass circuits 502, as illustrated by an ellipsis 518, in other embodiments any arbitrary number of such high-pass circuits 502 can be coupled in series with one another to form an overall high-pass circuitry network circuit. In such embodiments, each successive one of the high-pass circuits 502 would be coupled to an output port of the preceding high-pass circuit, that is, to the node linking the capacitor and inductor of that preceding high-pass circuit. Further in this regard, it should be appreciated that multiple high-pass (and/or low-pass) circuits can be implemented to manipulate filter bandwidth, passband insertion loss and slope/roll-off behavior and, in at least some such embodiments, the inductance (L) and capacitance (C) values would then be different compared to single-section circuit (with the cutoff frequency assumed to be unaltered).

Notwithstanding the description concerning FIG. 5, in which the respective inductors 510 of the respective high-pass circuits 502 are coupled downstream of the respective capacitors 508 of the respective high-pass circuits (in contrast to the arrangement of the high-pass circuit 304 of FIG. 3), in other embodiments the high-pass circuitry corresponding to the high-pass circuitry 214 of FIG. 2 can involve a network circuit including multiple series-connected high-pass circuits taking the form of the high-pass circuit 304 rather than the form of the high pass circuits 502 (or possibly take another form of high-pass circuit). Also, in alternate embodiments, the network circuitry corresponding to the high-pass circuitry 214 can take the form of a single one of the high-pass circuits 502 rather than the high-pass circuit 304. Additionally, although the low-pass circuits 302 of FIG. 4 take the same form as the low-pass circuit 302 of FIG. 3, in other embodiments it is possible that other forms of low-pass circuits can be employed including, for example, embodiments in which the respective capacitor of each low-pass circuit is positioned upstream relative to the respective inductor of the respective low-pass circuit.

Figure 6:
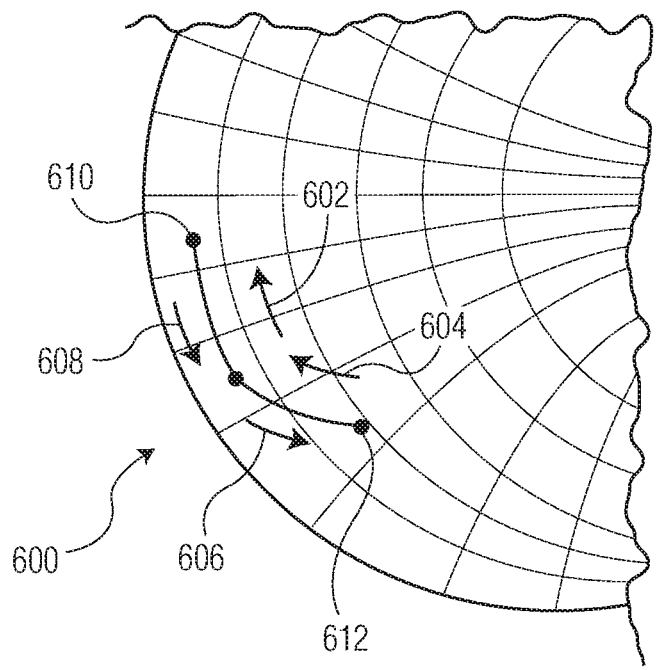
FIG. 6 is a cutaway portion of a Smith chart showing example operational effects of the presence of low-pass and high-pass circuits such as those of FIG. 3 in the improved hybrid PA circuit of FIG. 2.

Referring again to FIG. 2, as well as FIG. 6, various operational characteristics of embodiments of circuits encompassed by the hybrid PA circuit 200 having the intermediate circuitry 206 including the low-pass circuitry 212 and high-pass circuitry 214 (including any of the embodiments of such low-pass and high-pass circuitry described above in regard to FIG. 3, FIG. 4, and FIG. 5) are shown. First, in regard to the hybrid PA circuit 200 of FIG. 2, it should be appreciated that the low-pass circuitry 212 and high-pass circuitry 214 of the intermediate circuitry 206 impact the impedance of the intermediate circuitry 206 that exists at the second harmonic frequency (2f0) (which again is twice the frequency of a fundamental frequency of operation (f0)). More particularly, as illustrated in FIG. 2, the impedance at the second harmonic frequency (Z) that arises by virtue of the low-pass and high-pass circuitry 212, 214 is variable at the second harmonic frequency (2f0) between a first impedance ($Z_1$) and a second impedance ($Z_2$), respectively (e.g., $Z_1 \leq Z \leq Z_2$ at 2f0).

Also, the intermediate circuitry 206 and particularly the low-pass and high-pass circuitry 212, 214 thereof has particular effects also upon the phase shifts that occur between the final stage device 204 and the preliminary stage device 202. In particular, a phase shift ($\phi$) between an output terminal of the preliminary stage device 202 represented by a dashed line 226 and an input terminal of the final stage device 204 as represented by a dashed line 228 due to the low-pass and high-pass circuitry 212, 214 is approximately zero at the fundamental frequency f0 (e.g., $\phi \approx 0$ at f0). However, the phase shift ($\phi$) between those two locations (that is between the dashed line 228 and dashed line 226) due to the presence of the low-pass and high-pass circuitry 212, 214 is variable over some range at the second harmonic frequency (2f0), such as over a range between $\phi_1$ and $\phi_2$ as shown (e.g., $\phi_1 \leq \phi \leq \phi_2$). Although this range can vary depending upon the embodiment, in some embodiments the phase shift range can be for example a range in which $\phi_1=5$ degrees and $\phi_2=90$ degrees (e.g., 5 degrees$\leq \phi \leq$90 degrees). Alternatively, in other embodiments the phase shift range can be for example a range in which $\phi_1=5$ degrees and $\phi_2=180$ degrees or even 360 degrees (e.g., 5 degrees$\leq \phi \leq$180 degrees or 5 degrees$\leq \phi \leq$360 degrees). Still in other embodiments for example the phase shift range can include any phase shift from 0 to 180 degrees or even from 0 to 360 degrees.

Thus, while the impedance difference between the dashed lines 226 and 228 and phase shift between those two lines that arises due to the presence of the low-pass circuitry 212 and high-pass circuitry 214 is approximately zero at the fundamental frequency (f0), there can be an impedance change introduced by the presence of the low-pass circuitry and high-pass circuitry between those dashed lines 226 and 228 at the second harmonic frequency (2f0) as well as a phase shift that occurs between the dashed lines 226 and 228 at the second harmonic frequency (2f0). Additionally, the low-pass circuitry 212 and high-pass circuitry 214 are not used as an impedance transformer, and consequently the impedance (Z) at the fundamental frequency (f0) remains unchanged by the presence of the low-pass and high-pass circuitry—e.g., Z≈Z0 at f0, where Z0 is the characteristic impedance (@f0) at the interface of the dashed lines 226 and/or 228.

In addition to the aforementioned operational characteristics, FIG. 2 also illustrates how the presence of the low-pass circuitry 212 and high-pass circuitry 214 affects the reflection coefficient looking back toward the intermediate circuitry 206 at the dashed line 228 as well as looking back at the preliminary stage device 202 at the dashed line 226. As shown, the reflection coefficient (Γ) at the fundamental frequency in each case is zero (0), which can imply, for example, a 50 Ohm termination (e.g., Γ≈0 at f0 looking back at each of the locations of the dashed line 226 and the dashed line 228). Also, the reflection coefficient at the second harmonic frequency 2f0 in each case is approximately one (1), signifying a high reflection coefficient corresponding to a short circuit at the reference plane or an open circuit (e.g., Γ≈1 at 2f0 looking back at each of the locations of the dashed line 226 and the dashed line 228). At the same time, it should be appreciated also that the reflection coefficient (F) at the dashed line 228 can have a variable phase associated with it (again, for example, $\phi_1 \leq \phi \leq \phi_2$ at 2f0).

Further illustrating this manner of operation is FIG. 6, which is a cutaway portion 600 of a Smith chart illustrating how the presence of low-pass circuitry and high-pass circuitry corresponding to the low-pass circuitry 212 and high-pass circuitry 214 of FIG. 2 need not result in a shift of impedance or phase at the fundamental frequency (f0). More particularly, FIG. 6 shows exemplary effects of the first inductor 306, first capacitor 308, second inductor 310, and second capacitor 312 of the low-pass circuit 302 and high-pass circuit 304 of FIG. 3, namely, as first, second, third, and fourth shifts 602, 604, 606, and 608. Notwithstanding the presence of these different effects corresponding to the shifts 602, 604, 606, and 608, FIG. 6 additionally shows that the overall impedance experienced at the output terminal of the preliminary device corresponding to the dashed line 226 (and to the input terminal 314) remains the same or substantially the same as the impedance experienced at the input terminal of the final stage device 204 corresponding to the dashed line 228 (and to the output terminal 318).

More particularly in this regard, FIG. 6 is provided to illustrate how an arrangement such as that of FIG. 2 can experience no impedance transformation at a given fundamental frequency f0, notwithstanding the presence of circuit components such as the low-pass circuit 302 and the high-pass circuit 304. FIG. 6 first provides an example of how the impedance at the input terminal of a final stage device (e.g., at the output terminal 318 leading to the load impedance 324 in FIG. 3), which in this example is a first impedance at a location 610 on the Smith chart 600 (in this example, an impedance RS=RL=3−j3 Ohms), can experience a first shift from this impedance value to a second impedance at a location 612. Such a first shift in impedance can be understood as the result of the presence of a high-pass circuit such as the high-pass circuit 304, and the location 612 can be understood as corresponding to an intermediate node such as the intermediate node 316 between the high-pass circuit 304 and the low-pass circuit 302. Nevertheless, FIG. 6 further shows that the presence of a low-pass circuit such as the low-pass circuit 302 can in turn cause the impedance to experience a second shift back from the second impedance at the location 612 to (or substantially to) the first impedance at the location 610 when viewed at the output terminal of a preliminary device preceding the low-pass and high-pass circuits 302 and 304 (e.g., at the input terminal 314 to which the source impedance 322 is coupled in FIG. 3). Thus, this feature of operation of the intermediate circuitry 206 including the low-pass circuitry 302 and high-pass circuitry 304—namely, that this circuitry does not operate as an impedance transformer, such that Z(f0) remains unchanged between the dashed lines 228 and 226—is represented on the Smith chart of FIG. 6. More particularly, the Smith chart shows that the impedance Z(f0) is the same both when viewed at the dashed line 228 and when viewed at the dashed line 226—that is, the impedance Z(f0) has the value of the first impedance at the location 610 both at the dashed line 228 and also at the dashed line 226, which in the present example is an impedance $R_s = R_L = 3 - j3 \Omega$.

In view of the above discussion, it should be appreciated that the intermediate circuitry 206 between the preliminary stage device 202 and the final stage device 204—and resultant operational characteristics, such as harmonic termination characteristics—can be varied to optimize the RF performance of a PA circuit. More particularly, adjustment of the intermediate circuitry 206 allows for the second harmonic frequency (2f0) phase to be independently varied by optimizing the filter network elements such as the components of the low-pass (filter) circuitry 212 and the high-pass (filter) circuitry 214. In particular, the low-pass and high-pass circuitry provides flexibility in terms of $\phi$ with respect to the second harmonic frequency (2f0) for harmonic termination (e.g., (e.g., $\phi_{2f0}$).

In at least some embodiments, it is possible to achieve desired operational characteristics by modifying the characteristics of the intermediate circuitry 206, and particularly the phasing network portions thereof (e.g., the low-pass circuitry and high-pass circuitry 212, 214 thereof), by adjusting the number of low-pass and/or high-pass circuit sections that are present in the intermediate circuitry. More particularly, in at least some such embodiments, a phasing network implemented as n-section low-pass (e.g., $1 \leq n \leq 4$ or more) and m-section high-pass (e.g., $1 \leq m \leq 4$ or more) structures can entail: (a) n or $m \geq 2$ where n or m is the number of circuit elements or structures; (b) $\omega_{LP} > \omega_{HP}$; and (c) for $\phi_{LP}@\omega_o = -\phi_{HP}@\omega_o$, $1/\omega_{LP} = \omega_{HP}$. For example, if the network circuit 400 of FIG. 4 is implemented as the low-pass circuitry 212 of the intermediate circuitry 206 of the hybrid PA circuit 200 of FIG. 2, and the network circuit 500 of FIG. 5 is implemented as the high-pass circuitry 214 of the intermediate circuitry 206 of that hybrid PA circuit, then in such case the overall intermediate circuitry comprising the network circuits 400 and 500 would be a n-section and m-section phasing network (or combination of phasing networks) in which n=2 and m=2. It should be also understood that, in regard to the above discussion, the notation ω can be understood to refer to an angular frequency equaling $2\pi f$, e.g., $\omega_o$ can be understood to refer to the fundamental angular frequency, which would equal $2\pi(f0)$ and $2\omega_o$ can be understood to refer to the second harmonic angular frequency, which would equal $2\pi(f0)$).

With such assumptions, the phase variability at $2\omega_o$ will be as follows: (i) $\phi_{LP} @ 2\omega_o$ is function of $\omega_{LP}$ and (ii) $\phi_{HP}@2\omega_o$ is function of $\omega_{HP}$; and (iii) $\phi_{LP}@2\omega_o \neq -\phi_{HP}@2\omega_o$, which allows the phase at $2\omega_o$ to be independent of the phase at $\omega_o$. At the same time, it should be understood that the criteria expressed above to achieve variable phase @$2\omega_o$ requires scaling both L (inductive) and C (capacitive) components with $\omega_{LP}$ and $\omega_{HP}$. However, a reasonably effective approximation, with a limited range of phase @$2\omega_o$, can be achieved by only adjusting values of C (capacitance) with $\omega_{LP}$ and $\omega_{HP}$.

Figure 7:
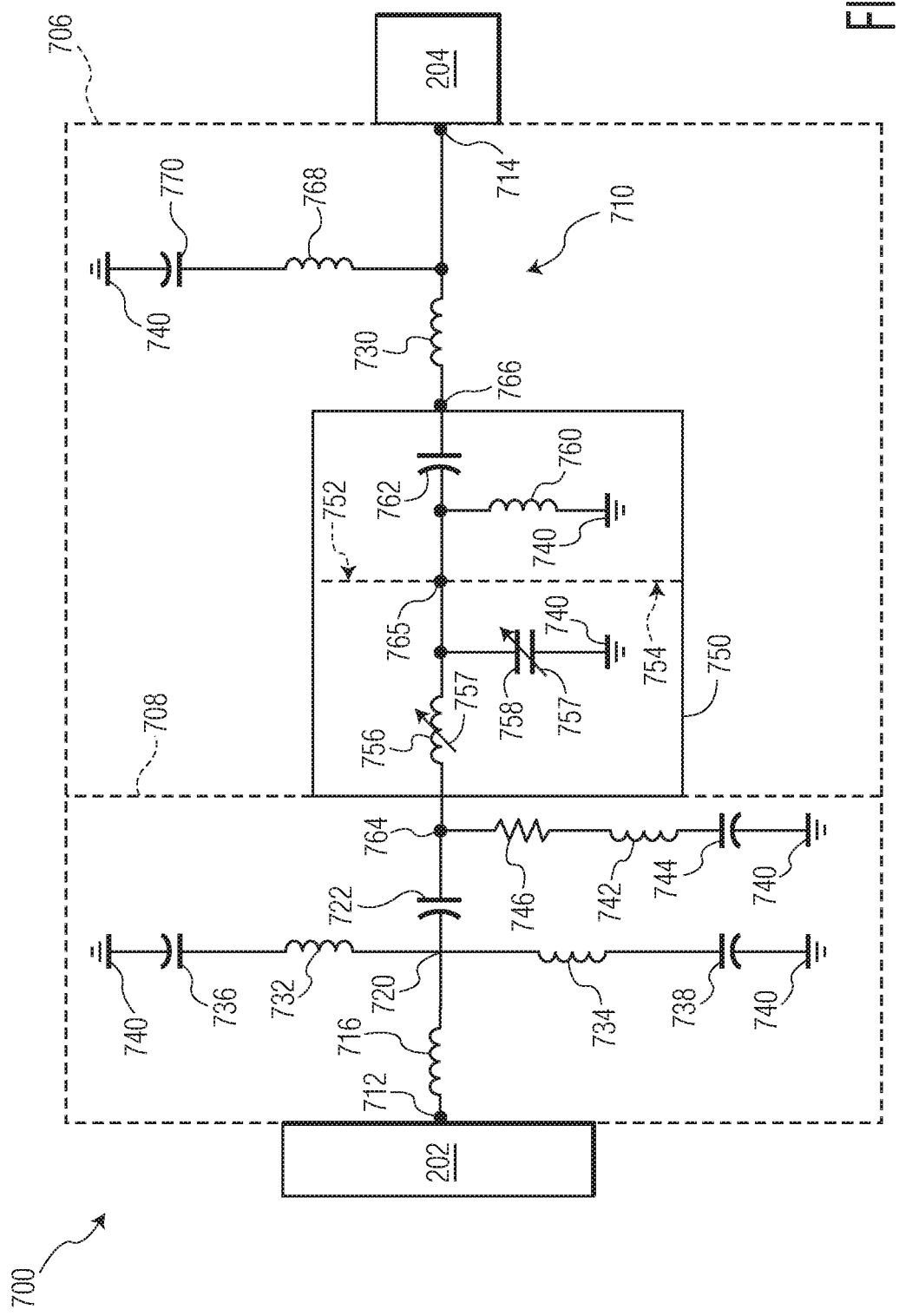
FIG. 7 is a schematic diagram illustrating in more detail an improved hybrid PA circuit having a combination low-pass-high-pass cascaded topology that is an example of an improved hybrid PA circuit in accordance with that of FIG. 2.

Turning to FIG. 7, a schematic diagram is provided to illustrate in more detail another example of an improved hybrid PA circuit 700 having a combination low-pass-high-pass cascaded topology that also is intended to be encompassed by the hybrid PA circuit 200 of FIG. 2. The improved hybrid PA circuit 700 includes the preliminary stage device 202, the final stage device 204, and intermediate circuitry 706 linking those two devices. The intermediate circuitry 706 can be considered an example embodiment of the intermediate circuitry 206 of FIG. 2, and the circuit 700 is configured so that the preliminary stage device 202 operates to drive the final stage device 204 by way of the intermediate circuitry 706. As shown, the intermediate circuitry 706 includes a first circuit portion 708, a second circuit portion 710, and a third circuit portion 750. The first circuit portion 708 is coupled between a first node 712 that is an output port of the preliminary stage device 202 (e.g., a drain terminal of an LDMOS device serving as the preliminary stage device) and a second node 764 that is an input port of the third circuit portion 750. Further, the second circuit portion 710 is coupled between a third node 766 that is an output port of the third circuit portion 750 and a fourth node 714 that is an input port of the final stage device 704 (e.g., a gate terminal of a GaN device).

Further as shown in the example embodiment of FIG. 7, the first circuit portion 708 includes a first inductor 716 coupled between the first node 712 and a fifth node 720, and a first capacitor 722 coupled between the fifth node 720 and the second node 764. Additionally, the first circuit portion 708 also includes a second inductor 732 and a third inductor 734, each of which is coupled to the fifth node 720, as well as a second capacitor 736 and a third capacitor 738. As shown, the second inductor 732 is coupled between the fifth node 720 and the second capacitor 736, which in turn is coupled between the second inductor and a ground (or ground terminal) 740. Also, the third inductor 734 is coupled between the fifth node 720 and the third capacitor 738, which in turn is coupled between the third inductor and the ground 740. Further, the first circuit portion 708 additionally includes a fourth inductor 742, a fourth capacitor 744, and a first resistor 746, where the first resistor is coupled between the second node 764 and the fourth inductor, where the fourth inductor is coupled between the first resistor and the fourth capacitor, and where the fourth capacitor is coupled between the fourth inductor and the ground 740.

Further as shown in FIG. 7, the second circuit portion 710 includes a fifth inductor 768, a fifth capacitor 770, and a sixth inductor 730. The fifth inductor 768 is coupled between the fourth node 714 and the fifth capacitor 770, and the fifth capacitor is coupled between the fifth inductor and the ground 740. The sixth inductor 730 couples the third node 766 with the fourth node 714. As for the third circuit portion 750, this circuit portion constitutes a phase network section and in the present example embodiment is illustrated as taking a form that is the same or substantially the same as the circuit 300 of FIG. 3.

More particularly, the third circuit portion 750 is shown to include a low-pass circuit 752 and a high-pass circuit 754 that respectively correspond to the low-pass circuit 302 (as well as the low-pass circuitry 212) and high-pass circuit 304 (as well as the high-pass circuitry 214), respectively. In this example embodiment, the low-pass circuit 752 includes a first inductor 756 and first capacitor 758, and the high-pass circuit 754 includes a second inductor 760 and a second capacitor 762. Further, the first inductor 756 of the low-pass circuit 752 is coupled between the second node 764 and an intermediate node 765 at which the low-pass circuit 752 is coupled to the high-pass circuit 754. Further, the second capacitor 762 is coupled between the intermediate node 765 and the third node 766. Additionally, the first capacitor 758 of the low-pass circuit 752 is coupled between the intermediate node 765 and the ground 740, and also the second inductor 760 of the high-pass circuit 754 is coupled between the intermediate node 765 and the ground 740.

Notwithstanding all of the above, however, the third circuit portion 750 is intended to be variable in characteristics, as particularly indicated by arrows 757 extending across the first inductor 756 and the first capacitor 758. Although the arrows 757 are particularly shown to extend across the first inductor 756 and the first capacitor 758 because those components are intended to be independently variable, in actuality the second inductor 760 and the second capacitor 762 also are variable in a manner dependent upon the respective capacitance and inductance values of the first capacitor and first inductor, respectively. That is, in this example, $C\_high=1/((2*\pi*f)*(2*\pi*f)*L1)$ and $L\_high=1/((2*\pi*f)*(2*\pi*C1))$, where L1 is the inductance of the first inductor 756, C1 is the capacitance of the first capacitor 758, C_high is the capacitance of the second capacitor 762, and L_high is the inductance of the second inductor 760. It should further be appreciated that, in this context, the term "variable" in at least some embodiments entails an arrangement in which the second harmonic frequency (2f0) phase can be varied without affecting the fundamental frequency (f0) phase by optimizing the first inductor 756, first capacitor 758, second inductor 760, and second capacitor 762. In at least some such embodiments, such optimization does not happen in real-time but nevertheless helps to fine-tune the PA performance, for example, due to part-to-part variation.

Further with respect to the embodiment of FIG. 7, it should be appreciated that the first circuit portion 708 serves an additional role in addition to communicating signals between the preliminary stage device 202 and the third circuit portion 750. More particularly in this regard, the first circuit portion 708 also serves to provide matching with respect to signals at or around the fundamental frequency (f0)—that is, matching at the fundamental (frequency) band. Likewise, the third circuit portion 750 also serves an additional role in addition to communicating signals between the first circuit portion 708 and the second circuit portion 710. However, unlike the first circuit portion 708 that provides matching with respect to signals at or around the fundamental frequency, the third circuit portion 750 serves instead to provide matching with respect to signals at or around the second harmonic frequency (2f0). Additionally, the presence of the third circuit portion 750 also enables the improved hybrid PA circuit 700 to exhibit all (or one or more) of the operational characteristics described above in regard to FIG. 2, FIG. 3, FIG. 4, FIG. 5, and FIG. 6.

In at least some embodiments, the third circuit portion 750 may have characteristics that are identical or substantially similar to those of the circuit 300 described above. For example, in at least some embodiments, the third circuit portion 750 may be configured for operation at a fundamental frequency of operation (f0) in a range of about 800 megahertz (MHz) to about 6.0 gigahertz (GHz). In such embodiments, the first inductor 756 has an inductance value in a range of about zero (0) nanohenries (nH) to about fifty (50) nH, the first capacitor 758 has a capacitance value in a range of about zero (0) picofarads (pF) to about fifty (50) pF, the second inductor 760 has an inductance value in a range of about 0 nH to about 50 nH, and the second capacitor 762 has a capacitance value in a range of about 0 pF to about 50 pF. In other embodiments, circuit 750 may be designed to operate at lower or higher fundamental frequencies, and the various capacitance and inductance ranges may have lower or higher boundaries. Either way, low-pass circuit 752 is configured to pass RF signal energy up to a first cutoff frequency slightly greater than the fundamental frequency (e.g., from about 1% up to about 10% above the fundamental frequency) to the intermediate node 765, and to shunt RF signal energy above that first cutoff frequency to the ground terminal 740. In addition, high-pass circuit 754 is configured to shunt RF signal energy with frequencies just below a second cutoff frequency slightly below the fundamental frequency (e.g., from about 1% up to about 10% below the fundamental frequency) to the ground terminal 740, and to pass RF signal energy above the second cutoff frequency to the third node 766. Notwithstanding the above description, however, in other embodiments the third circuit portion 750 (or portion(s) or component(s) thereof) can have one or more other characteristics.

Figure 8:
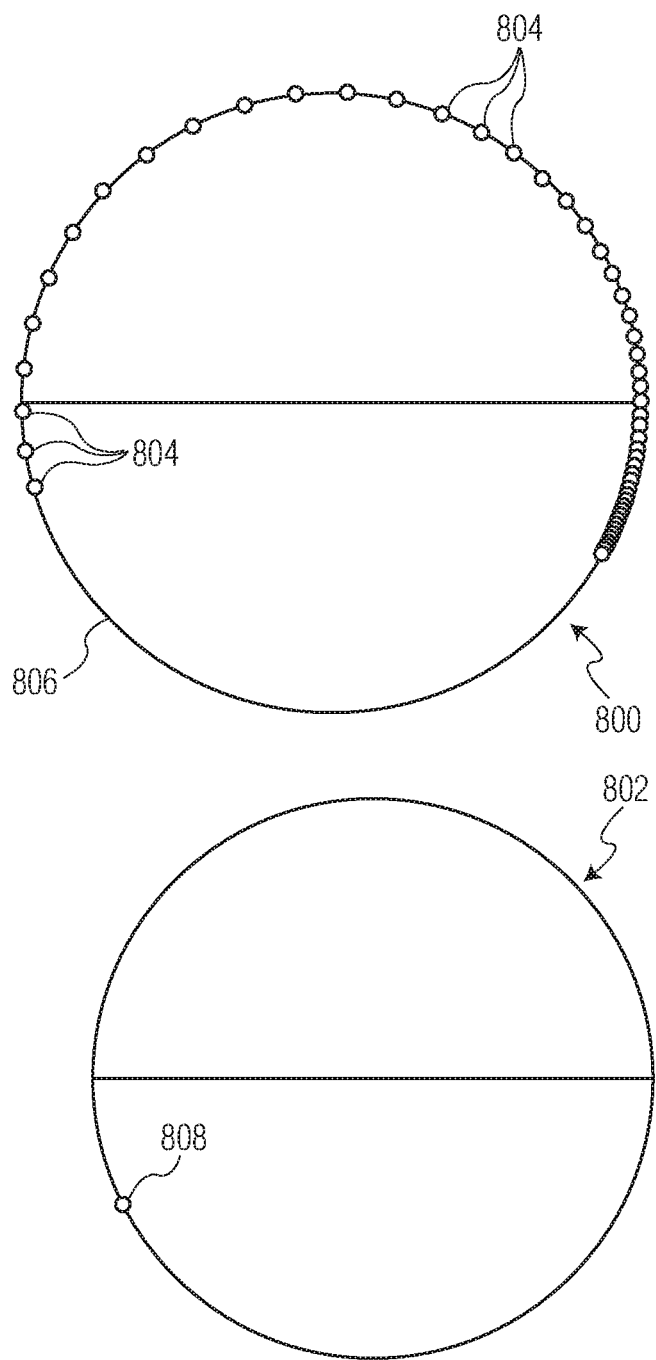
FIG. 8 shows a pair of Smith charts illustrating example operational characteristics of the improved hybrid PA circuit of FIG. 7.

FIG. 8 particularly illustrates two operational characteristics of the improved hybrid PA circuit 700, by way of a first Smith chart 800 and a second Smith chart 802 that respectively illustrate example operational characteristics of the circuit 700 at a second harmonic frequency (2f0) of 7 gigahertz (GHz) and at a fundamental frequency (f0) of 3.5 GHz that is half of that second harmonic frequency, respectively. The first Smith chart 800 particularly shows how, by employing the third circuit portion 750 constituting the phase networks section of the circuit 700, flexibility in 2f0 phase can be achieved. That is, by adjusting the attributes of the third circuit portion 750 (e.g., by adjusting the number of low-pass circuit sections, the number of high-pass circuit sections, or the characteristics of one or more of the circuit components of any of those circuit sections), the phase at the second harmonic frequency (2f0) of 7 GHz can be varied to a variety of values represented by a series of positions 804. This phase variation or higher tunability can be achieved even while the overall reflection coefficient remains equal to one, as indicated by the location of all of the positions 804 along an outer perimeter (or circumference) 806 of the first Smith chart 800.

By comparison, the second Smith chart 802 additionally shows how, notwithstanding variation in the attributes of the third circuit portion 750 as discussed above, the presence and operation of that third circuit portion in providing second harmonic frequency termination does not affect the impedance of the intermediate circuitry 706 (Z(f0)). That is, as shown, notwithstanding changes to the third circuit portion 750 that result in the phase variation shown in the first Smith chart 800, the impedance of the circuitry 706 (Z(f0)) remains constant at a single location 808 with respect to operation at the fundamental frequency (f0) of 3.5 GHz (which again is half of the second harmonic frequency mentioned above (7 GHz)). Thus, fundamental immunity and lower dispersion is achieved at the fundamental frequency. It should also be noted that, in the present example of FIG. 8, the variation in inductance values of the first inductor 758 that allows for the variation in phase that is shown in the first Smith chart 800 is variation across a range of 1 nH to 15 nH, and the second Smith chart 802 is consistent with this variation in the inductance as well as variation in capacitance of the first capacitor 758 in the range of 1 pF to 15 pF.

Figure 9:
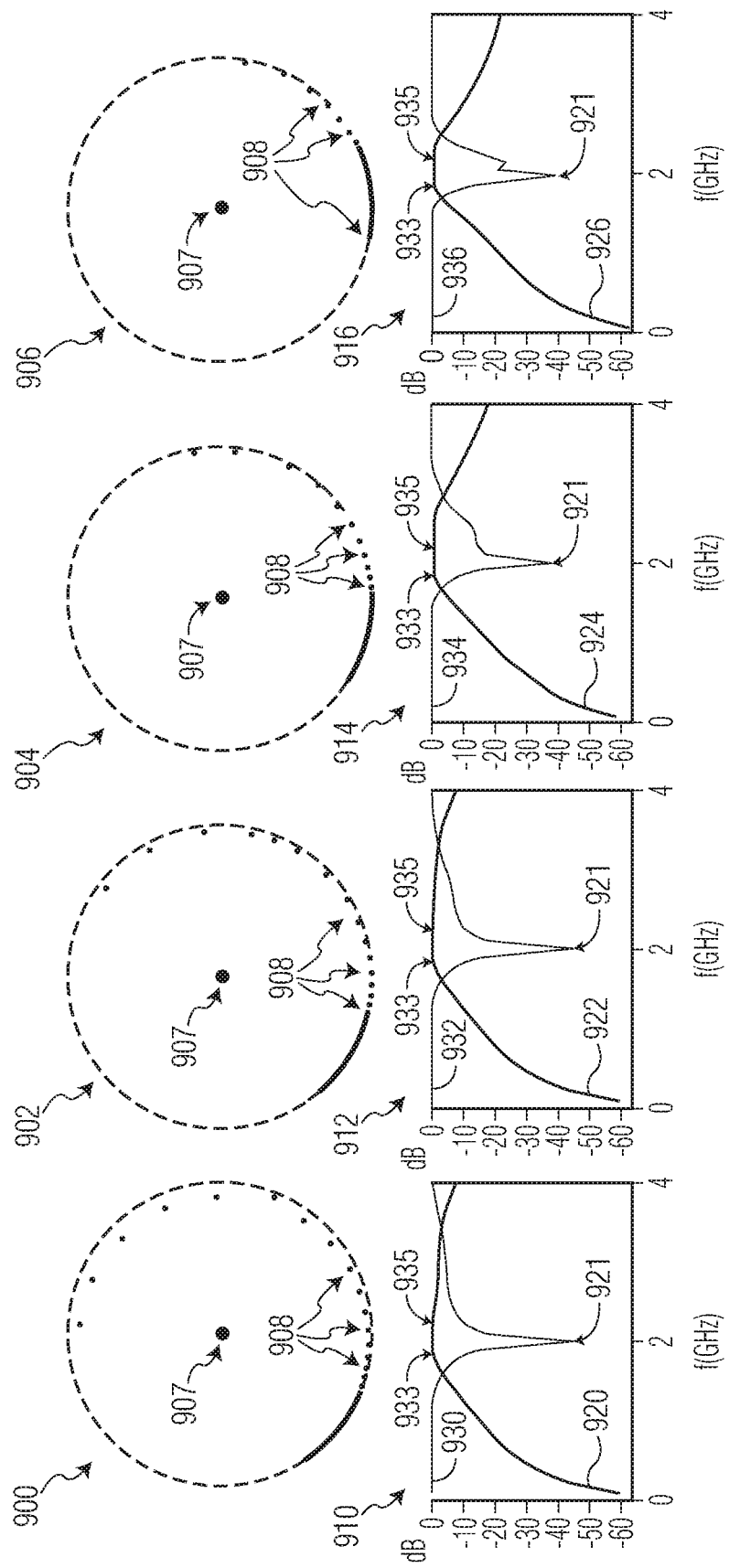
FIG. 9 shows a set of four additional Smith charts and four graphs that additionally illustrate example operational characteristics of an improved hybrid PA circuit.
Figure 10:
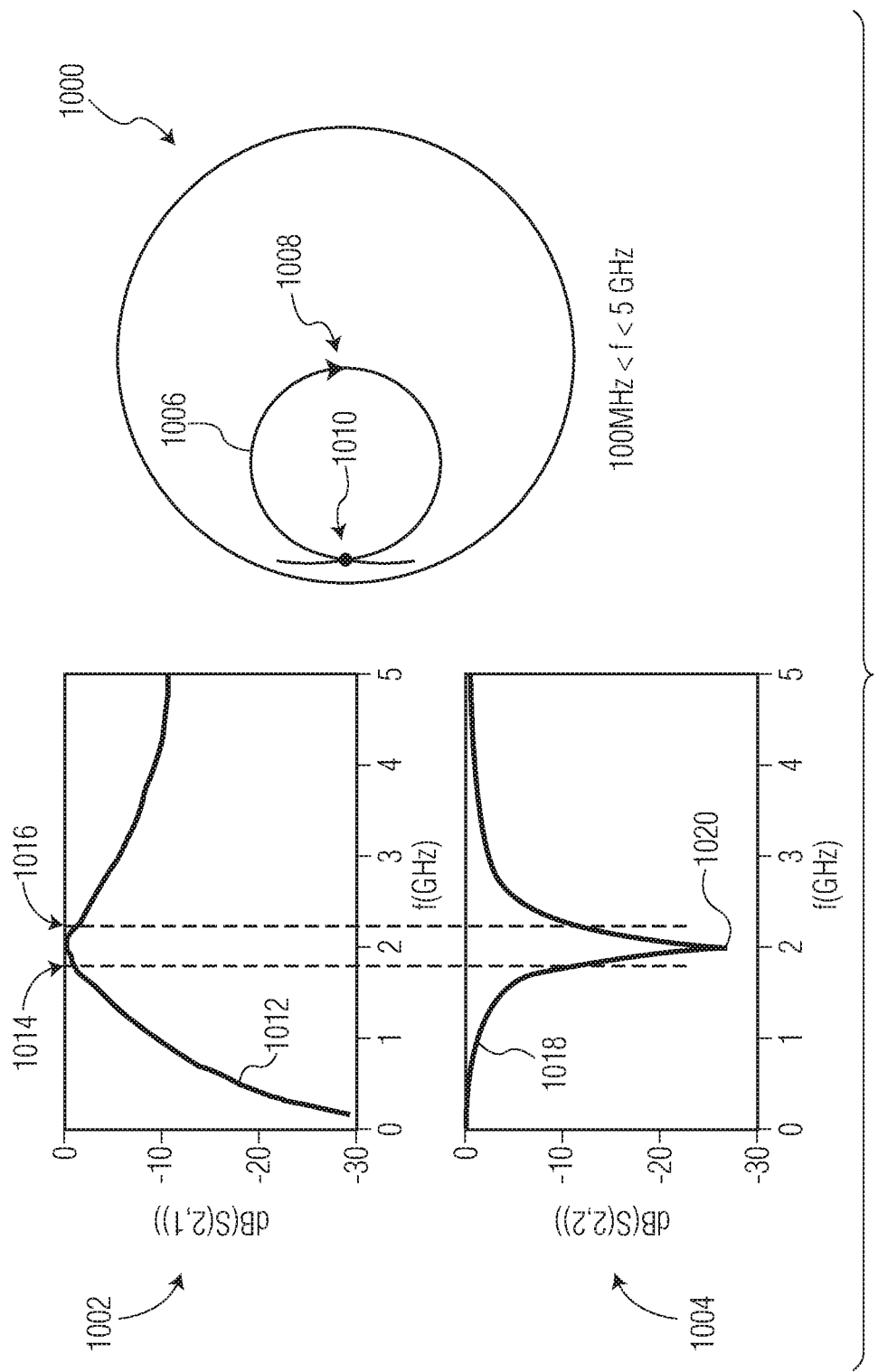
FIG. 10 shows a further Smith chart and pair of graphs that additionally illustrate example operational characteristics of an improved hybrid PA circuit.

Turning to FIG. 9 and FIG. 10, additional example characteristics of a hybrid PA circuit are shown that are consistent with the form of the hybrid PA circuit 200 of FIG. 2, particularly when modeled as the circuit 300 shown in FIG. 3, and particularly when assuming that the source impedance 322 has a value of 50 Ohms and the load impedance 324 also has a value of 50 Ohms. In the case of FIG. 9, first, second, third, and fourth Smith charts 900, 902, 904, 906, respectively, are provided to illustrate example impedances of four different embodiments of the circuit 300 when the first inductor 306 and first capacitor 308 respectively take on different sets of inductance and capacitance values, respectively, both in the terms of the impedance at the fundamental frequency (f0) and at the second harmonic frequency (2f0). Additionally, FIG. 9 also provides first, second, third, and fourth transmission coefficient (or reflection coefficient or reflectance) graphs 910, 912, 914, 916, respectively, which illustrate the transmission coefficients through the circuit 300 as a function of frequency, for each of the different respective embodiments of the circuit 300 having the different inductance and capacitance parameters used to generate the Smith charts 900, 902, 904, 906, respectively.

In regard to the example characteristics illustrated in FIG. 9, it should be recognized that these example characteristics have been determined by way of a simulation assuming that the hybrid PA circuit 200 employed ideal L-C elements, that the fundamental frequency (or frequency band) is approximately 2 GHz, and that Z(f0) remains constant at 50 Ohms notwithstanding variation in Z(2f0). More particularly, to achieve the example charts and graphs provided in FIG. 9, the inductance values of the first inductor 306 are 2 nH, 2.6 nH, 4.0 nH, and 6.0 nH, respectively, for the first, second, third and fourth Smith charts 900, 902, 904, 906, respectively. Further, the capacitance values of the first capacitor 308 used to achieve the first, second, third and fourth Smith charts 900, 902, 904, 906, respectively, in each case is a range of capacitance from 0.5 pF to 20 pF. As already described with respect to FIG. 7, the inductance value of the second inductor 310 can be about equal to the reciprocal of the product of the capacitance value of the first capacitor 308 and $2\pi(f)^2$. Similarly, the capacitance value of the second capacitor 312 can be about equal to the reciprocal of the product of the inductance value of the first inductor 306 and $2\pi(f)^2$.

The Smith charts 900, 902, 904 and 906 and the graphs 910, 912, 914, and 916 illustrate several operational characteristics of the circuit 300 (as one example embodiment of the hybrid PA circuit 200) in particular. First, with respect to each of the four different embodiments that are shown, the impedance of the circuit 300 at the fundamental frequency (f0) is at the center of each of the Smith charts 900, 902, 904, and 906, as represented by a respective dot 907 shown on each of the Smith charts. Relatedly, it should be appreciated that the reflection coefficient at the fundamental frequency (f0) for each of the four embodiments of the circuit 300 equals 0. By comparison, in regard to operation of the four different embodiments of the circuit 300 at the second harmonic frequency (2f0), the reflection coefficient equals 1 in all four embodiments regardless of the different capacitances used for the first capacitator 308. This is shown by respective series of dots 908 that are shown on each of the Smith charts 900, 902, 904, and 906, and that for the most part are positioned at or close to the respective outer perimeters of the respective Smith charts.

As for the transmission coefficient graphs 910, 912, 914, and 916, these graphs respectively illustrate both the reflection performance and the transmission performance, as a function of frequency, for the respective four different embodiments of the circuit 300 corresponding to the Smith charts 900, 902, 904, and 906, respectively. More particularly, with respect to the first transmission coefficient graph 910, it can be seen that the transmission coefficient S(2,1) (or gain) through the circuit is substantially 100% (a high value at or around 0 dB) at frequencies ranging from less than 2 GHz up to nearly 4 GHz, as represented by a first curve 920. By comparison, the transmission coefficient S(1,1) as shown by a second curve 930, which represents the return loss, has a high value at or around 0 dB across the entire 0 to 4 GHz frequency range shown except at and proximate to a frequency of 2 GHz at a dip point 921, at which the transmission coefficient drops to approximately −40 dB. It can appreciated further that the portion of the second curve 930 in which the transmission coefficient is low is generally within a region between a first frequency of 1.8 GHz at a location 933 and a second frequency of 2.2 GHz at a location 935 respectively below and above the dip point 921.

Further as shown with respect to each of the second, third, and fourth transmission coefficient graphs 912, 914, and 916, respectively, each of the other embodiments of the circuit 300 associated with the Smith charts 902, 904, and 906, respectively, achieves transmission coefficients that are similar (even if not absolutely identical) to those of the first transmission coefficient graph 910. That is, as indicated by respective first curves 922, 924, and 926, respectively, shown in the second, third, and fourth transmission coefficient graphs 912, 914, and 916, respectively, the transmission coefficients S(2,1) (or gain) through each of the respective embodiments of the circuit 300 corresponding to those respective graphs are substantially 100% (with high values at or around 0 dB) at frequencies ranging from less than 2 GHz up to nearly 4 GHz. Also, the transmission coefficients S(1,1) or return losses associated with the respective embodiments of the circuit 300 corresponding to the second, third, and fourth transmission coefficient graphs 912, 914, and 916, respectively, as represented by respective second curves 932, 934, 936, respectively, are high except at and proximate to a frequency of 2 GHz at respective dip points 921. It can be appreciated further that the respective portions of the respective second curve 932, 934, and 936 in which the respective transmission coefficient S(1,1) are low are generally within respective regions between a first frequency of 1.8 GHz at respective locations 933 below the respective dip points 921 and a second frequency of 2.2 GHz at respective locations 935 above the respective dip points 921.

Referring additionally to FIG. 10, further example operational characteristics information concerning a further example embodiment of the circuit 300 is provided by an additional Smith chart 1000 and first and second additional graphs 1002 and 1004, respectively. This example particularly presumes that the first inductor 306 has an inductance value of 0.49 nH, and that the first capacitor 308 has a capacitance value of 0.5 pF. Also, as already described with respect to FIG. 7 and FIG. 9, in this example embodiment the inductance value of the second inductor 310 can be about equal to the reciprocal of the product of the capacitance value of the first capacitor 308 and $2\pi(f)^2$, and the capacitance value of the second capacitor 312 can be about equal to the reciprocal of the product of the inductance value of the first inductor 306 and $2\pi(f)^2$. It should be appreciated that the operational characteristics/results shown in the Smith chart 1000 and the graphs 1002, 1004 were generated by way of a simulation that assumed a Q of approximately 40 for the inductors, resulting in about a 0.4 dB in-band loss.

Both the Smith chart 1000 and the graphs 1002 and 1004 show variation of operation of the circuit 300 over a large frequency range from 0 (or approximately 100 MHz) to about 5 GHz, with 2 GHz being the fundamental frequency (or frequency band) of interest (f0). The Smith chart 1000 illustrates how the impedance of the circuit 300 varies over this range, by way of a curve 1006. More particularly, the Smith chart 1000 shows that, at a fundamental frequency of 2 GHz, the circuit 300 has a first impedance value corresponding to a first location 1008, which in this example is 46.314−j1.222. Also, the Smith chart 100 shows that the circuit 300 has a transmission coefficient S(2,2) equaling 0.04/−160.932 at that fundamental frequency. Further, the Smith chart 1000 additionally shows that, at a second harmonic frequency of 4 GHz, the circuit 300 has a second impedance value corresponding to a second location 1010, which is 2.417−j0.282, and a transmission coefficient S(2,2) equaling 0.908/−179.352.

As for the graphs 1002 and 1004, these show example transmission coefficient performance for the embodiment of the circuit 300 that is the subject of the Smith chart 1000. More particularly, the graph 1002 includes a transmission curve 1012 showing that a transmission level through the circuit 300 (that is, a transmission coefficient S(2,1)) is substantially 100% (with high values at or around 0 dB) at frequencies ranging from less than 2 GHz up to nearly 4 GHz, at least between a 1.8 GHz location 1014 and a 2.2 GHz location 1016. Further, the transmission coefficient S(2,2) is high (e.g., predominantly at the 0 dB level) across most of the 0 to 5 GHz frequency range shown by the graphs 1002 and 1004 except at or proximate to a frequency of 2 GHz at a dip point 1020, as shown by a second curve 1018 provided in the graph 1004. The drop in the transmission coefficient S(2,2) is particularly strong between the locations 1014 and 1016 corresponding to the 1.8 and 2.2 GHz frequencies below and above the 2 GHz frequency of the dip point 1020.

Figure 11:
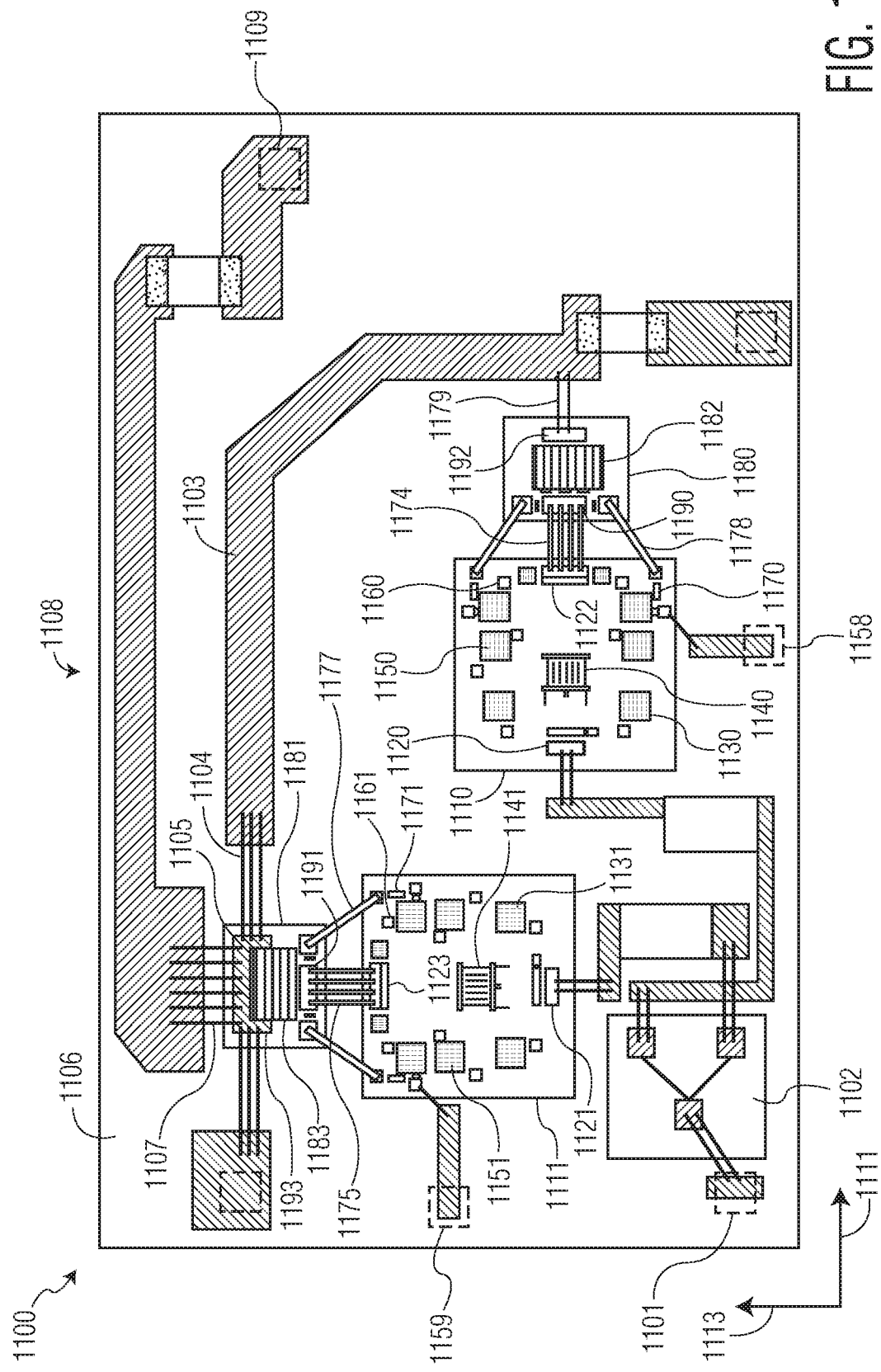
FIG. 11 is a top view of an example of an RF amplifier device that particularly employs at least one improved hybrid PA circuit having a combination low-pass-high-pass cascaded topology as discussed above in accordance with any of FIG. 2 through FIG. 10.

The improved hybrid PA circuits described above with respect to FIG. 2 through FIG. 10 can be implemented in a variety of larger circuits and/or in a variety of manners, and/or operate in a variety of roles, depending upon the embodiment. Referring now additionally to FIG. 11, it should be appreciated for example that two (or more) of the improved hybrid PA circuits such as any of those described above with respect to FIG. 2 through FIG. 10 (e.g., the hybrid PA circuit 200) can be implemented as the main amplifier or peaking amplifier of a Doherty power amplifier, within a packaged device. In such embodiments, further for example, two different improved hybrid PA circuits can respectively provide two parallel amplification paths that independently amplify RF input signals to produce separate amplified RF output signals. Additionally, although FIG. 11 particularly relates to a two-path Doherty power amplifier, in other embodiments more than two amplification paths (e.g., three, four, or some other number of paths) can be provided through the implementation of more than two of the improved hybrid PA circuits. Also, in some embodiments, multiple amplification paths may be electrically coupled together as part of a multi-path amplifier system.

More particularly, FIG. 11 is a top view of an example of an RF amplifier device 1100 that includes a Doherty power amplifier with a main amplification path and a peaking amplification path. The RF amplifier device 1100 will alternatively be referred to below as a "Doherty power amplifier module." In the Doherty power amplifier module 1100, the main amplification path includes a silicon driver stage IC die 1110 and a GaN final stage IC die 1180, and the peaking amplification path also includes a silicon driver stage IC die 1111 and a GaN final stage IC die 1181, in accordance with an example embodiment. As described in further detail below, the silicon driver stage IC die 1110 not only serves as a preliminary stage device corresponding to the preliminary stage device 202 of FIG. 2, but also can serve as or provide intermediate circuitry such as the intermediate circuitry 206, including low-pass and high-pass filter circuits as described above.

The Doherty power amplifier module 1100 also includes a substrate in the form of a multiple-layer PCB 1106, which includes at least one dielectric layer (e.g., formed from FR-4, ceramic, or other PCB dielectric materials), and two or more conductive layers. In the present example embodiment, the conductive layer on the top surface of the PCB 1106 is a patterned conductive layer. Various conductive features (e.g., conductive pads and traces) formed from portions of the top patterned conductive layer may serve as attachment points for the dies 1110, 1111, 1180, 1181 and other discrete components, and also may provide electrical connectivity between the dies 1110, 1111, 1180, 1181 and the other discrete components. Another conductive layer may serve as a ground reference plane. In some embodiments, one or more additional patterned conductive layers may provide conductive connections between the dies 1110, 1111, 1180, 1181, the discrete components, and the ground reference plane.

Also in the present embodiment, a bottom conductive layer is utilized to provide externally-accessible, conductive landing pads, where the locations of some example landing pads 1101, 1109, 1158, 1159 are indicated with dashed boxes in FIG. 11. These landing pads (among others, not illustrated) enable surface mounting of the Doherty power amplifier module 1100 onto a separate substrate (not illustrated) that provides electrical connectivity to other portions of an RF system. Although the module 1100 is depicted as a land grid array (LGA) module, the module 1100 alternatively may be packaged as a pin grid array module, a QFN module, or another type of package. In addition, in some embodiments, the dies 1110, 1111, 1180, 1181 may be housed in one or more discrete device packages, each of which includes a conductive flange upon which the dies are mounted, along with input and output leads that are coupled to conductive traces on a PCB that includes other portions of the Doherty amplifier circuit.

The Doherty power amplifier module 1100 includes a power splitter 1102, a two-stage main amplifier that includes the silicon driver stage IC die 1110 and the GaN final stage IC die 1180 that are cascade-coupled with one another, and a two-stage peaking amplifier that includes the silicon driver stage IC die 1111 and GaN final stage IC die 1181 that are cascade-coupled coupled with one another, as well as various phase shift and impedance matching elements, and a combiner. The conductive landing pad 1101 exposed at the bottom surface of the PCB 1106 functions as the RF signal input terminal for the module 1100. Through one or more conductive structures (e.g., vias, traces, and/or wirebonds), the landing pad 1101 is electrically coupled to an input to the power splitter 1102. The power splitter 1102, which is coupled to the mounting surface of the PCB 1106, may include one or more discrete die and/or components, although it is shown in FIG. 11 as a single component. The power splitter 1102 includes an input terminal and two output terminals. The input terminal is electrically coupled through one or more conductive structures (e.g., vias, traces, and/or wirebonds) to the landing pad 1101 to receive an input RF signal. The output terminals of the power splitter 1102 are electrically coupled through one or more conductive structures (e.g., vias, traces, and/or wirebonds) to input terminals 1120 and 1121 respectively for the main and peaking amplifiers, respectively.

The power splitter 1102 is configured to split the power of the input RF signal received through the landing pad 1101 into first and second RF signals, which are produced at the output terminals of the power splitter 1102. In addition, the power splitter 1102 may include one or more phase shift elements configured to impart about a 90 degree phase difference between the RF signals provided at the output terminals. The first and second RF signals produced at the outputs of the power splitter 1102 may have equal or unequal power. The first output of the power splitter is electrically coupled to a main amplifier path (e.g., to the main amplifier), and the second output of the power splitter is electrically coupled to a peaking amplifier path (e.g., to the peaking amplifier). In the illustrated embodiment, the RF signal produced at the second power splitter output is delayed by about 90 degrees from the RF signal produced at the first power splitter output. In other words, the RF signal provided to the peaking amplifier path is delayed by about 90 degrees from the RF signal provided to the main amplifier path.

The first RF signal produced by the power splitter 1102 is amplified through the main amplifier path, which includes the silicon driver stage IC die 1110, the GaN final stage IC die 1180, and a phase shift element 1103. The second RF signal produced by the power splitter 1102 is amplified through the peaking amplifier path, which includes the silicon driver stage IC die 1111 and the GaN final stage IC die 1181. The silicon driver stage IC die 1110 and the GaN final stage IC die 1180 of the main amplifier path are electrically coupled together in a cascade arrangement between the input terminal 1120 of the silicon driver stage IC die 1110 (corresponding to a main amplifier input) and an output terminal 1192 of the GaN final stage IC die 1180 (corresponding to a main amplifier output).

The silicon driver stage IC die 1110 includes a plurality of integrated circuits. In the present example embodiment, the integrated circuitry of the die 1110 includes the input terminal 1120, an output terminal 1122, an input impedance matching circuit 1130, a silicon power transistor 1140, an integrated portion of an interstage impedance matching circuit 1150, a bias voltage control circuit 1160, and an integrated portion of a harmonic control circuit 1170. One or both of the input impedance matching circuit 1130 and the interstage impedance matching circuit 1150 can be considered as corresponding to or encompassing the intermediate circuitry 206 described above, including the low-pass circuitry 212 and high-pass circuitry 214 thereof. Although not shown in detail, it should be appreciated that the various circuits and components within the silicon driver stage IC die 1110 are electrically coupled with one another as appropriate to achieve an arrangement corresponding to the preliminary stage device 202 and intermediate circuitry 206 of FIG. 2.

The first output of the power divider 1102 is electrically coupled to the input terminal 1120 of the silicon driver stage IC die 1110 through various conductive traces, circuitry, and wirebonds or other types of electrical connections. The landing pad (or bias land) 1158 is electrically coupled through additional conductive structures, a wirebond (or other types of electrical connections), and a terminal to the corresponding bias voltage control circuit 1160 for the GaN transistor 1182. Although not shown in FIG. 11, additional bias lands may be electrically coupled to bias voltage control circuitry for the silicon transistor gate and drain.

The GaN final stage IC die 1180 includes a plurality of integrated circuits. In the present example embodiment, the integrated circuitry of the die 1180 includes an input terminal 1190, the output terminal 1192, and a GaN power transistor 1182. Although not shown in detail, it should be appreciated that the various circuits and components within the GaN final stage IC die 1180 are configured and electrically coupled together as appropriate to achieve an arrangement corresponding to the final stage device 204 of FIG. 2, with the GaN power transistor 1182 particularly constituting an example embodiment of the final stage PA transistor device 208.

The output terminal 1122 of the silicon driver stage IC die 1110 is electrically coupled to the input terminal 1190 of the GaN final stage IC die 1180 through a wirebond array 1174 or another type of electrical connection. The input terminal 1190 is electrically coupled to the gate of the GaN power transistor 1182. The gate of the GaN power transistor 1182 also is electrically coupled through one or more wirebonds 1178 or another type of electrical connection to the integrated portion of the harmonic control circuit 1170 in the silicon driver stage IC die 1110.

The amplified first RF signal is produced at the output terminal 1192 of the GaN final stage IC die 1180. According to the present embodiment, the output terminal 1192 is electrically coupled (e.g., through wirebonds 1179 or another type of electrical connection) to the phase shift element 1103. Also according to the present embodiment, the phase shift element 1103 has a first end that is proximate to the output terminal 1192 of the GaN final stage IC die 1180, and a second end that is proximate to an output terminal 1193 of the GaN final stage IC die 1181. For example, the phase shift element 1103 may be implemented with a lambda/4 (λ/4) transmission line (e.g., a microstrip transmission line with a 90-degree electrical length) that extends between its first and second ends. The phase shift element 1103 may impart about a 90 degree relative phase shift to the amplified first RF signal as the signal travels from the first end of the phase shift element to the second end of the phase shift element.

As mentioned above, the second RF signal produced by the power splitter 1102 is amplified through the peaking amplifier path, which includes the silicon driver stage IC die 1111, and the GaN final stage IC die 1181. The silicon driver stage IC die 1111 and the GaN final stage IC die 1181 of the peaking amplifier path are electrically coupled together in a cascade arrangement between the input terminal 1121 of the silicon driver stage IC die 1111 (corresponding to a peaking amplifier input) and the output terminal 1193 of the GaN final stage IC die 1181 (corresponding to a peaking amplifier output). The silicon driver stage IC die 1111 includes a plurality of integrated circuits. In the present example embodiment, the integrated circuitry of die 1111 includes the input terminal 1121, an output terminal 1123, an input impedance matching circuit 1131, a silicon power transistor 1141, an integrated portion of an interstage impedance matching circuit 1151, a bias voltage control circuit 1161, and an integrated portion of a harmonic control circuit 1171. One or both of the input impedance matching circuit 1131 and the interstage impedance matching circuit 1151 can be considered as corresponding to the intermediate circuitry 206 described above, including the low-pass circuitry 212 and high-pass circuitry 214 thereof. Although not shown in detail, it should be appreciated that the various circuits and components within the silicon driver stage IC die 1111 may be configured and electrically coupled with one another as appropriate to achieve an arrangement corresponding to the preliminary stage device 202 and intermediate circuitry 206 of FIG. 2.

The second output of the power divider 1102 is electrically coupled to the input terminal 1121 of the silicon driver stage IC die 1111 through various conductive traces, circuitry, and wirebonds or another type of electrical connection. The landing pad (or bias land) 1159 is electrically coupled through additional conductive structures, a wirebond (or another type of electrical connection), and a terminal to the corresponding bias voltage control circuit 1161 for the GaN transistor 1183. Although not shown in FIG. 11, additional landing pads (or bias lands) may be electrically coupled to bias voltage control circuitry for the silicon transistor gate and drain.

The GaN final stage IC die 1181 includes a plurality of integrated circuits. In an embodiment, the integrated circuitry of the die 1181 includes an input terminal 1191, the output terminal 1193, and a GaN power transistor 1183. Although not shown in detail, it should be appreciated that the various circuits and components within the GaN final stage IC die 1181 may be configured and electrically coupled together as appropriate to achieve an arrangement corresponding to the final stage device 204 of FIG. 2, with the GaN power transistor 1183 particularly constituting an example embodiment of the final stage PA transistor device 208.

The output terminal 1123 of the silicon driver stage IC die 1111 is electrically coupled to the input terminal 1191 of the GaN final stage IC die 1181 through a wirebond array 1175 or another type of electrical connection. The input terminal 1191 is electrically coupled to the gate of the GaN power transistor 1183. The gate of the GaN power transistor 1183 also is electrically coupled through one or more wirebonds 1177 or another type of electrical connection to the integrated portion of the harmonic control circuit 1171 in the silicon driver stage IC die 1111.

The signal path through the cascade-coupled peaking amplifier dies 1111, 1181 is in a direction extending from the RF input terminal 1121 to the RF output terminal 1193, which direction is indicated by an arrow 1113. Further, the signal path through the cascade-coupled main amplifier dies 1110, 1180 is in a direction extending from the silicon driver stage IC die input terminal 1120 to the GaN final stage IC die output terminal 1192, which direction is indicated by an arrow 1117, which is shown to be perpendicular to the arrow 1113. Thus, as can be seen in FIG. 11, the signal paths through the cascade-coupled peaking amplifier dies 1111, 1181 and the cascade-coupled main amplifier dies 1110, 1180 extend in significantly different directions, and more particularly the signal paths are orthogonal in the embodiment of FIG. 11. Stated in another manner, the RF signal path through the dies 1111, 1181 is orthogonal to the RF signal path through the dies 1110, 1180. Even though the dies 1110, 1111, 1180, 1181 may be positioned relatively close together, their orthogonal orientations may significantly reduce coupling between signals carried through and amplified by the main and peaking amplifier paths.

The amplified second RF signal is produced by the GaN final stage IC die 1181 at the RF output terminal 1193. According to the present example embodiment, the RF output terminal 1193 is electrically coupled (e.g., through wirebonds 1104 or another type of electrical connection) to the second end of the phase shift element 1103. Accordingly, the amplified first RF signal produced by the GaN final stage IC die 1180 is conveyed to the RF output terminal 1193, and the output terminal 1193 functions as a summing node 1105 for the amplified first and second RF signals. When the various phase shifts imparted separately on the first and second RF signals are substantially equal, the amplified first and second RF signals combine substantially in phase at summing node 1105.

The RF output terminal 1193 (and thus summing node 1105) is electrically coupled (e.g., through wirebonds 1107 or another type of electrical connection) to an output network 1108, which functions to present the proper load impedances to each of the main and peaking amplifier dies 1180, 1181. In addition, the output network 1108 may include a decoupling capacitor, as shown. Although not shown in FIG. 11, the output network 1108 may also include various conductive traces, additional discrete components, and/or integrated components (e.g., capacitors, inductors, and/or resistors) to provide the desired impedance matching. The output network 1108 is electrically coupled through the PCB 1106 to the conductive landing pad 1109 exposed at the bottom surface of the PCB 1106. The landing pad 1109 functions as the RF output node for the Doherty power amplifier module 1100.

Notwithstanding the above description, it should be appreciated that the present disclosure is not intended to be limited in scope to the above-described embodiments but rather is intended to encompass a variety of additional embodiments of improved hybrid power amplifier circuits or modules, as well as circuits, modules, systems, or devices that include or utilize such improved hybrid power amplifier circuits or modules. Among other things, although several of the above-described hybrid power amplifier circuits or modules employ combinations of pairs of preliminary and final stage devices (e.g., silicon and GaN transistor devices), the present disclosure is intended to encompass additional embodiments in which there are more than two stages of devices including, for example, embodiments in which there are multiple preliminary stage devices that all (in parallel or in series) are coupled to a final stage device.

Further, although the terms preliminary stage device and final stage device are employed above to refer to successive amplification devices that provide successive levels of amplification in a hybrid amplification circuit or module (and that can be formed by way of different types of semiconductor materials), the use of these terms is for convenience and is not intended to limit the scope of the present disclosure. For example, the present disclosure is also intended to encompass embodiments of hybrid amplification circuits or modules in which there are more than two amplification devices in series or succession between a RF input terminal and RF (amplified) output terminal of the respective hybrid amplification circuit or module, and in which a first device is a silicon amplification device, a second device is a gallium-nitride (GaN) or other III-V type material amplification device, and a third device is another amplification device that may be made from silicon, GaN, or other III-V type or semiconductor materials. In such embodiments, even though the second (GaN) device might be considered the final stage device in view of how that term is used above, that second device can also be considered an intermediate or next stage device given the presence of the third device.

Also, it should be appreciated that the present disclosure is intended to encompass methods of operation of (e.g., methods of amplification by way of) hybrid amplification circuits or modules, or circuits, modules, systems, or devices that include or employ such hybrid amplification circuits or modules, as well as methods of manufacturing (or forming, or assembling) any of such circuits, modules, systems or devices. For example the present disclosure is intended to encompass methods of amplification that involve providing a hybrid power amplifier circuit or module with any of the above-described features and then causing that circuit or module to perform any of a variety of operational steps. In some such embodiments, such operational steps can include receiving a RF input signal at a preliminary stage amplification device, amplifying the RF input signal by way of the preliminary stage amplification device to generate an amplified RF signal having a first component at a fundamental frequency and a second component at a harmonic frequency that is a multiple of the fundamental frequency. The operational steps can also include modifying the amplified RF signal by way of the intermediate circuitry so as to provide a modified amplified RF signal to the final stage amplification device; and further amplifying the modified amplified RF signal so as to generate a RF output signal, where the modifying of the amplified RF signal includes shifting a phase of the second component of the amplified RF signal.

Accordingly, in at least some embodiments encompassed herein, the present disclosure relates to a hybrid power amplifier circuit that includes a preliminary stage amplification device, a final stage amplification device, and intermediate circuitry at least indirectly coupling the preliminary stage amplification device and the final stage amplification device. The intermediate circuitry includes a low-pass circuit and a high-pass circuit, and the hybrid power amplifier circuit is configured to amplify a first signal component at a fundamental frequency. Due at least in part to the intermediate circuitry, a phase of a second signal component at a harmonic frequency that is a multiple of the fundamental frequency is shifted.

Also, in at least some example embodiments encompassed herein, the present disclosure relates to a hybrid power amplifier module. The hybrid power amplifier module includes a substrate and a first die supported at least indirectly upon the substrate and upon which is formed, at least in part, a preliminary stage amplification circuit. Further, the hybrid power amplifier module also includes a second die supported at least indirectly upon the substrate and upon which is formed, at least in part, a final stage amplification circuit. Additionally, the hybrid power amplifier module further includes intermediate circuitry supported at least indirectly upon the substrate, the intermediate circuitry at least indirectly coupling the preliminary stage amplification device and the final stage amplification device. The intermediate circuitry includes a low-pass circuit and a high-pass circuit, and the hybrid power amplifier circuit is configured to amplify a first signal component at a fundamental frequency. Due at least in part to the intermediate circuitry, a phase of a second signal component at a harmonic frequency that is a multiple of the fundamental frequency is shifted.

Additionally, in at least some example embodiments encompassed herein, the present disclosure relates to a method of providing amplification. The method includes providing a hybrid power amplifier module having a preliminary stage amplification device, a final stage amplification device, and intermediate circuitry at least indirectly coupling the preliminary stage amplification device and the final stage amplification device, where the intermediate circuitry includes a low-pass circuit and a high-pass circuit. Further, the method includes receiving a RF input signal at the preliminary stage amplification device, and amplifying the RF signal by way of the preliminary stage amplification device to generate an amplified RF signal having a first component at a fundamental frequency and a second component at a harmonic frequency that is a multiple of the fundamental frequency. Additionally, the method includes modifying the amplified RF signal by way of the intermediate circuitry so as to provide a modified amplified RF signal to the final stage amplification device, and further amplifying the modified amplified RF signal so as to generate a RF output signal, where the modifying of the amplified RF signal includes shifting a phase of the second component of the amplified RF signal. Additionally, in at least some such embodiments, the preliminary stage amplification device includes a silicon transistor device, the final stage amplification device includes a gallium-nitride (GaN) transistor device, the harmonic frequency is two times the fundamental frequency, the silicon transistor device and intermediate circuitry is formed on a silicon die, and the final stage amplification device is formed on a GaN die.

It should be appreciated from the above discussion that improved hybrid PA circuits as encompassed herein, including but not limited to those discussed above, may provide any one or more of a variety of advantages depending upon the embodiment. In at least some embodiments encompassed herein, the improved hybrid PA circuits are configurable so as to be set to provide any phase angle at a second harmonic frequency (2f0) of operation, with near 1.0, and may ease implementation of an input matching network. Thus, at least some embodiments encompass herein make possible a higher degree of flexibility in setting phase of 2f0.

Additionally, in at least some embodiments, the improved hybrid PA circuits may provide immunity between the second harmonic frequency (2f0) circuit and the matching circuit at the fundamental frequency (f0). Further, in at least some embodiments, the improved hybrid PA circuits may operate without adding any (or any substantial) dispersion at the fundamental frequency (f0) due to the f0 circuit. Additionally, in at least some embodiments, the improved hybrid PA circuits may have no impact on Q for matching because of 2f0 termination. Further, in at least some embodiments, the improved hybrid PA circuits may provide more flexibility in optimizing second harmonic frequency (2f0) phase without impacting the fundamental impedance that is presented at the input terminal of the final stage (e.g., GaN) device.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A hybrid power amplifier circuit configured to amplify a first signal component at a fundamental frequency, the hybrid power amplifier circuit comprising:
   a preliminary stage amplification device that includes a first transistor that is a silicon-based transistor device;
   a final stage amplification device that includes a second transistor that is a III-V transistor device made from a semiconductor material selected from gallium nitride, gallium arsenide, gallium phosphide, indium phosphide, and indium antimonide;
   intermediate circuitry coupling the preliminary stage amplification device and the final stage amplification device,
   wherein the intermediate circuitry includes a low-pass circuit and a high-pass circuit, the intermediate circuitry provides a harmonic termination of a second signal component at a harmonic frequency that is a multiple of the fundamental frequency, and the intermediate circuitry does not implement an impedance transformation of the first signal component at the fundamental frequency; and
   input pre-matching circuitry coupling the intermediate circuitry and the final stage amplification device, wherein the input pre-matching circuitry implements the impedance transformation of the first signal component at the fundamental frequency.

2. The hybrid power amplifier circuit of claim 1, wherein the silicon-based transistor device is a LDMOS transistor device.

3. The hybrid power amplifier circuit of claim 1, wherein the III-V transistor device is a gallium-nitride (GaN) transistor device, and
   wherein the harmonic frequency is two times the fundamental frequency.

4. The hybrid power amplifier circuit of claim 1, wherein the intermediate circuitry includes an input port coupled with an output terminal of the preliminary stage device, and also includes an output port coupled with an input terminal of the final stage device.

5. The hybrid power amplifier circuit of claim 4, wherein the low-pass circuit includes a first low-pass filter circuit having a first inductor and a first capacitor, wherein the high-pass circuit includes a first high-pass filter circuit having a second capacitor and a second inductor.

6. The hybrid power amplifier circuit of claim 5, wherein the first inductor is coupled to the input port, wherein the second capacitor is coupled to the output port, and wherein the first inductor and the second capacitor are coupled in series between the input port and the output port.

7. The hybrid power amplifier circuit of claim 6, wherein the first inductor and the second capacitor are coupled to one another by way of an intermediate node.

8. The hybrid power amplifier circuit of claim 7, wherein the first capacitor is coupled between the intermediate node and a ground terminal, and wherein the first inductor is coupled between the intermediate node and the ground terminal or between the output port and the ground terminal.

9. The hybrid power amplifier circuit of claim 5, wherein the low-pass circuit further includes a first network having a plurality of low-pass filter circuits including the first low-pass filter circuit, and wherein the high-pass circuit includes a second network having a plurality of high-pass filter circuits including the first high-pass filter circuit.

10. The hybrid power amplifier circuit of claim 9, wherein the first inductor is coupled to the input port, wherein the second capacitor is coupled to the output port, and wherein the first inductor and the second capacitor are coupled in series between the input port and the output port.

11. The hybrid power amplifier circuit of claim 5, wherein the preliminary stage amplification device includes a silicon transistor device, and wherein the final stage amplification device includes a gallium-nitride (GaN) transistor device.

12. A hybrid power amplifier module configured to amplify a first signal component at a fundamental frequency, the hybrid power amplifier module comprising:
    a substrate;
    a first die supported at least indirectly upon the substrate and upon which is formed, at least in part, a preliminary stage amplification circuit that includes a first transistor that is a silicon-based transistor device;
    a second die supported at least indirectly upon the substrate and upon which is formed, at least in part, a final stage amplification circuit that includes a second transistor that is a III-V transistor device made from a semiconductor material selected from gallium nitride, gallium arsenide, gallium phosphide, indium phosphide, and indium antimonide;

intermediate circuitry supported at least indirectly upon the substrate, the intermediate circuitry coupling the preliminary stage amplification device and the final stage amplification device, wherein the intermediate circuitry includes a low-pass circuit and a high-pass circuit, the intermediate circuitry provides a harmonic termination of a second signal component at a harmonic frequency that is a multiple of the fundamental frequency, and the intermediate circuitry does not implement an impedance transformation of the first signal component at the fundamental frequency; and input pre-matching circuitry supported at least indirectly upon the substrate, the input pre-matching circuitry coupling the intermediate circuitry and the final stage amplification device, wherein the input pre-matching circuitry implements the impedance transformation of the first signal component at the fundamental frequency.

13. The hybrid power amplifier module of claim 12, wherein the intermediate circuitry is formed, at least in part, upon the first die, wherein the first die is a silicon die, and wherein the second die is a gallium-nitride (GaN) die.

14. The hybrid power amplifier module of claim 13, wherein the harmonic frequency is two times the fundamental frequency.

15. A method of providing amplification, the method comprising:

providing a hybrid power amplifier module having a preliminary stage amplification device that includes a first transistor that is a silicon-based transistor device, a final stage amplification device that includes a second transistor that is a III-V transistor device made from a semiconductor material selected from gallium nitride, gallium arsenide, gallium phosphide, indium phosphide, and indium antimonide, intermediate circuitry coupling the preliminary stage amplification device and the final stage amplification device, wherein the intermediate circuitry includes a low-pass circuit and a high-pass circuit, and input pre-matching circuitry coupling the intermediate circuitry and the final stage amplification device;

receiving a RF input signal at the preliminary stage amplification device;

amplifying the RF signal by way of the preliminary stage amplification device to generate an amplified RF signal having a first component at a fundamental frequency and a second component at a harmonic frequency that is a multiple of the fundamental frequency;

modifying the amplified RF signal by way of the intermediate circuitry so as to provide a modified amplified RF signal to the input pre-matching circuitry, wherein modifying the amplified RF signal includes harmonically terminating the second component at the harmonic frequency without implementing an impedance transformation of the first signal component at the fundamental frequency;

further modifying the modified amplified RF signal by way of the input pre-matching circuitry so as to provide a further modified amplified RF signal to the final stage amplification device, wherein further modifying the modified amplified RF signal includes implementing the impedance transformation of the first signal component at the fundamental frequency; and further amplifying the further modified amplified RF signal so as to generate a RF output signal.

16. The method of claim 15, wherein the preliminary stage amplification device includes a silicon transistor device, wherein the final stage amplification device includes a gallium-nitride (GaN) transistor device, wherein the harmonic frequency is two times the fundamental frequency, wherein the silicon transistor device and intermediate circuitry is formed on a silicon die, and wherein the final stage amplification device is formed on a GaN die.

* * * * *